United States Patent [19]
Schofield

[11] Patent Number: 6,163,283
[45] Date of Patent: Dec. 19, 2000

[54] THERMOMETER CODING CIRCUITRY

[75] Inventor: William George John Schofield, Binfield, United Kingdom

[73] Assignee: Fujitsu Microelectronics Europe GmbH, Dreieich-Buchschlag, Germany

[21] Appl. No.: 09/227,200

[22] Filed: Jan. 8, 1999

[30] Foreign Application Priority Data

Jan. 8, 1998 [GB] United Kingdom .................... 9800384

[51] Int. Cl.$^7$ ............................. H03M 1/00; H03M 1/66; H03M 1/80; H03M 7/00
[52] U.S. Cl. .............................. 341/50; 341/50; 341/133; 341/136; 341/144; 341/153
[58] Field of Search .............................. 341/50, 133, 136, 341/144, 153

[56] References Cited

U.S. PATENT DOCUMENTS

| | | | |
|---|---|---|---|
| 5,633,636 | 5/1997 | Reyhani . | |
| 5,844,515 | 12/1998 | Park | 341/133 |
| 5,929,798 | 7/1999 | Baek | 341/153 |
| 5,955,980 | 9/1999 | Hanna | 341/120 |
| 5,977,899 | 11/1999 | Adams | 341/145 |

FOREIGN PATENT DOCUMENTS 0 328 215  8/1989  European Pat. Off. .

OTHER PUBLICATIONS

Razavi, Behzad, "Principles of Data Conversion System Design", pp. 90–94.

*Primary Examiner*—Michael Tokar
*Assistant Examiner*—Vibol Tan
*Attorney, Agent, or Firm*—Staas & Halsey LLP

[57] ABSTRACT

Coding circuitry (34), for use for example in selecting cells of a cell array in a digital-to-analog converter, produces first and second sets of thermometer-coded output signals in dependence upon a binary input signal. As the input signal increases progressively in value from a first value to a second value, the first-set output signals (COLA) are activated in a predetermined sequence and the second-set output signals (COLB) are deactivated in a predetermined sequence. As the input signal increases progressively in value from the second value to a third value, the first-set output signals are deactivated in a predetermined sequence and the second-set output signals are activated in a predetermined sequence.

Such coding circuitry reduces the numbers of output signals that change in response to changes in the input-signal value.

In another embodiment (FIG. 12) the coding circuitry includes respective row, column and depth decoders (58, 56, 54). The row decoder receives the two most significant bits S4 and S5 of a binary input word and derives therefrom a set of thermometer-coded row selection signals (ROW0–2). The column decoder receives the two middle-order bits S2 and S3 of the binary input word and derives therefrom at least one set of thermometer-coded column selection signals (COLA0–2,COLB0–2). The depth decoder receives the two least-significant bits S0 and S1 of the binary input word and derives therefrom at least one set of thermometer-coded depth selection signals (DEPA0–2,DEPB0–2).

Such coding circuitry can enable selection of elements from amongst a large array of elements using only a small number of thermometer-coded signals.

42 Claims, 12 Drawing Sheets

| BINARY INPUT WORD | | | THERMOMETER-CODED SIGNALS | | | | | | |
|---|---|---|---|---|---|---|---|---|---|
| D3 | D2 | D1 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

| | COLA0 | COLB0 | COLA1 | COLB1 | COLA2 | COLB2 | COLA3 | COLB3 | COLA4 | COLB4 | COLA5 | COLB5 | COLA6 | COLB6 | ROW ↓ |
|---|---|---|---|---|---|---|---|---|---|---|---|---|---|---|---|
| 1 — ROW 0 — | $r_n$ 0 $r_{n+1}$ | 1 | $c_n$=COLA1 2 | | 3 | | 4 | | 5 | | 6 | | 7 | | 0 |
| ROW 0 — ROW 1 — | 8 | 9 | $c_n$=COLB1 10 | | 11 | | 12 | | 13 | | 14 | | 15 | | 1 |
| ROW 1 — ROW 2 — | 16 | 17 | $c_n$=COLA1 18 | | 19 | | 20 | | 21 | | 22 | | 23 | | 2 |
| ROW 2 — ROW 3 — | 24 | 25 | $c_n$=COLB1 26 | | 27 | | 28 | | 29 | | 30 | | 31 | | 3 |
| ROW 3 — ROW 4 — | 32 | 33 | $c_n$=COLA1 34 | | 35 | | 36 | | 37 | | 38 | | 39 | | 4 |
| ROW 4 — ROW 5 — | 40 | 41 | $c_n$=COLB1 42 | | 43 | | 44 | | 45 | | 46 | | 47 | | 5 |
| ROW 5 — ROW 6 — | 48 | 49 | $c_n$=COLA1 50 | | 51 | | 52 | | 53 | | 54 | | 55 | | 6 |
| ROW 6 — 0 — | $r_n$ 56 $r_{n+1}$ | 57 | $c_n$=COLB1 58 | | 59 | | 60 | | 61 | | 62 | | 63 | | 7 |
| COLUMN → | 0 | 1 | 2 | | 3 | | 4 | | 5 | | 6 | | 7 | | |

FIG. 4

| CODE D5-D0 | ROW S:[543] | COL S:[210] | ROW [6543210] | COL A [6543210] | COL B [6543210] |
|---|---|---|---|---|---|
| 0 | 000 | 000 | 0000000 | 0000000 | 1111111 |
| 1 | 000 | 001 | 0000000 | 0000001 | 0111111 |
| 2 | 000 | 010 | 0000000 | 0000011 | 0011111 |
| 3 | 000 | 011 | 0000000 | 0000111 | 0001111 |
| 4 | 000 | 100 | 0000000 | 0001111 | 0000111 |
| 5 | 000 | 101 | 0000000 | 0011111 | 0000011 |
| 6 | 000 | 110 | 0000000 | 0111111 | 0000001 |
| 7 | 000 | 111 | 0000000 | 1111111 | 0000000 |
| 8 | 001 | 000 | 0000001 | 1111111 | 0000000 |
| 9 | 001 | 001 | 0000001 | 0111111 | 0000001 |
| 10 | 001 | 010 | 0000001 | 0011111 | 0000011 |
| 11 | 001 | 011 | 0000001 | 0001111 | 0000111 |
| 12 | 001 | 100 | 0000001 | 0000111 | 0001111 |
| 13 | 001 | 101 | 0000001 | 0000011 | 0011111 |
| 14 | 001 | 110 | 0000001 | 0000001 | 0111111 |
| 15 | 001 | 111 | 0000001 | 0000000 | 1111111 |
| 16 | 010 | 000 | 0000011 | 0000000 | 1111111 |
| 17 | 010 | 001 | 0000011 | 0000001 | 0111111 |
| 18 | 010 | 010 | 0000011 | 0000011 | 0011111 |
| 19 | 010 | 011 | 0000011 | 0000111 | 0001111 |
| 20 | 010 | 100 | 0000011 | 0001111 | 0000111 |
| 21 | 010 | 101 | 0000011 | 0011111 | 0000011 |
| 22 | 010 | 110 | 0000011 | 0111111 | 0000001 |
| 23 | 010 | 111 | 0000011 | 1111111 | 0000000 |
| 24 | 011 | 000 | 0000111 | 1111111 | 0000000 |
| 25 | 011 | 001 | 0000111 | 0111111 | 0000001 |
| 26 | 011 | 010 | 0000111 | 0011111 | 0000011 |
| 27 | 011 | 011 | 0000111 | 0001111 | 0000111 |
| 28 | 011 | 100 | 0000111 | 0000111 | 0001111 |
| 29 | 011 | 101 | 0000111 | 0000011 | 0011111 |
| 30 | 011 | 110 | 0000111 | 0000001 | 0111111 |
| 31 | 011 | 111 | 0000111 | 0000000 | 1111111 |
| 32 | 100 | 000 | 0001111 | 0000000 | 1111111 |
| 33 | 100 | 001 | 0001111 | 0000001 | 0111111 |
| 34 | 100 | 010 | 0001111 | 0000011 | 0011111 |
| 35 | 100 | 011 | 0001111 | 0000111 | 0001111 |
| 36 | 100 | 100 | 0001111 | 0001111 | 0000111 |
| 37 | 100 | 101 | 0001111 | 0011111 | 0000011 |
| 38 | 100 | 110 | 0001111 | 0111111 | 0000001 |
| 39 | 100 | 111 | 0001111 | 1111111 | 0000000 |
| 40 | 101 | 000 | 0011111 | 1111111 | 0000000 |
| 41 | 101 | 001 | 0011111 | 0111111 | 0000001 |
| 42 | 101 | 010 | 0011111 | 0011111 | 0000011 |
| 43 | 101 | 011 | 0011111 | 0001111 | 0000111 |
| 44 | 101 | 100 | 0011111 | 0000111 | 0001111 |
| 45 | 101 | 101 | 0011111 | 0000011 | 0011111 |
| 46 | 101 | 110 | 0011111 | 0000001 | 0111111 |
| 47 | 101 | 111 | 0011111 | 0000000 | 1111111 |
| 48 | 110 | 000 | 0111111 | 0000000 | 1111111 |
| 49 | 110 | 001 | 0111111 | 0000001 | 0111111 |
| 50 | 110 | 010 | 0111111 | 0000011 | 0011111 |
| 51 | 110 | 011 | 0111111 | 0000111 | 0001111 |
| 52 | 110 | 100 | 0111111 | 0001111 | 0000111 |
| 53 | 110 | 101 | 0111111 | 0011111 | 0000011 |
| 54 | 110 | 110 | 0111111 | 0111111 | 0000001 |
| 55 | 110 | 111 | 0111111 | 1111111 | 0000000 |
| 56 | 111 | 000 | 1111111 | 1111111 | 0000000 |
| 57 | 111 | 001 | 1111111 | 0111111 | 0000001 |
| 58 | 111 | 010 | 1111111 | 0011111 | 0000011 |
| 59 | 111 | 011 | 1111111 | 0001111 | 0000111 |
| 60 | 111 | 100 | 1111111 | 0000111 | 0001111 |
| 61 | 111 | 101 | 1111111 | 0000011 | 0011111 |
| 62 | 111 | 110 | 1111111 | 0000001 | 0111111 |
| 63 | 111 | 111 | 1111111 | 0000000 | 1111111 |

FIG. 9

| CODE D5-D0 | ROW [210] | COL A [210] | COL B [210] | DEP A [210] | DEP B [210] |
|---|---|---|---|---|---|
| 0 | 000 | 000 | 111 | 000 | 111 |
| 1 | 000 | 000 | 111 | 001 | 011 |
| 2 | 000 | 000 | 111 | 011 | 001 |
| 3 | 000 | 000 | 111 | 111 | 000 |
| 4 | 000 | 001 | 011 | 111 | 000 |
| 5 | 000 | 001 | 011 | 011 | 001 |
| 6 | 000 | 001 | 011 | 001 | 011 |
| 7 | 000 | 001 | 011 | 000 | 111 |
| 8 | 000 | 011 | 001 | 000 | 111 |
| 9 | 000 | 011 | 001 | 001 | 011 |
| 10 | 000 | 011 | 001 | 011 | 001 |
| 11 | 000 | 011 | 001 | 111 | 000 |
| 12 | 000 | 111 | 000 | 111 | 000 |
| 13 | 000 | 111 | 000 | 011 | 001 |
| 14 | 000 | 111 | 000 | 001 | 011 |
| 15 | 000 | 111 | 000 | 000 | 111 |
| 16 | 001 | 111 | 000 | 000 | 111 |
| 17 | 001 | 111 | 000 | 001 | 011 |
| 18 | 001 | 111 | 000 | 011 | 001 |
| 19 | 001 | 111 | 000 | 111 | 000 |
| 20 | 001 | 011 | 001 | 111 | 000 |
| 21 | 001 | 011 | 001 | 011 | 001 |
| 22 | 001 | 011 | 001 | 001 | 011 |
| 23 | 001 | 011 | 001 | 000 | 111 |
| 24 | 001 | 001 | 011 | 000 | 111 |
| 25 | 001 | 001 | 011 | 001 | 011 |
| 26 | 001 | 001 | 011 | 011 | 001 |
| 27 | 001 | 001 | 011 | 111 | 000 |
| 28 | 001 | 000 | 111 | 111 | 000 |
| 29 | 001 | 000 | 111 | 011 | 001 |
| 30 | 001 | 000 | 111 | 001 | 011 |
| 31 | 001 | 000 | 111 | 000 | 111 |
| 32 | 011 | 000 | 111 | 000 | 111 |
| 33 | 011 | 000 | 111 | 001 | 011 |
| 34 | 011 | 000 | 111 | 011 | 001 |
| 35 | 011 | 000 | 111 | 111 | 000 |
| 36 | 011 | 001 | 011 | 111 | 000 |
| 37 | 011 | 001 | 011 | 011 | 001 |
| 38 | 011 | 001 | 011 | 001 | 011 |
| 39 | 011 | 001 | 011 | 000 | 111 |
| 40 | 011 | 011 | 001 | 000 | 111 |
| 41 | 011 | 011 | 001 | 001 | 011 |
| 42 | 011 | 011 | 001 | 011 | 001 |
| 43 | 011 | 011 | 001 | 111 | 000 |
| 44 | 011 | 111 | 000 | 111 | 000 |
| 45 | 011 | 111 | 000 | 011 | 001 |
| 46 | 011 | 111 | 000 | 001 | 011 |
| 47 | 011 | 111 | 000 | 000 | 111 |
| 48 | 111 | 111 | 000 | 000 | 111 |
| 49 | 111 | 111 | 000 | 001 | 011 |
| 50 | 111 | 111 | 000 | 011 | 001 |
| 51 | 111 | 111 | 000 | 111 | 000 |
| 52 | 111 | 011 | 001 | 111 | 000 |
| 53 | 111 | 011 | 001 | 011 | 001 |
| 54 | 111 | 011 | 001 | 001 | 011 |
| 55 | 111 | 011 | 001 | 000 | 111 |
| 56 | 111 | 001 | 011 | 000 | 111 |
| 57 | 111 | 001 | 011 | 001 | 011 |
| 58 | 111 | 001 | 011 | 011 | 001 |
| 59 | 111 | 001 | 011 | 111 | 000 |
| 60 | 111 | 000 | 111 | 111 | 000 |
| 61 | 111 | 000 | 111 | 011 | 001 |
| 62 | 111 | 000 | 111 | 001 | 011 |
| 63 | 111 | 000 | 111 | 000 | 111 |

FIG. 16

THERMOMETER CODING CIRCUITRY

CROSS REFERENCE TO RELATED APPLICATIONS

The subject application is related to the following U.S. and respective foreign priority applications:

DIFFERENTIAL SWITCHING CIRCUITRY filed concurrently and claiming priority from Great Britain application No. 9800387.4 filed Jan. 8, 1998 assigned to Fujitsu Microelectronics Limited;

MIXED-SIGNAL CIRCUITRY AND INTEGRATED CIRCUIT DEVICES filed concurrently and claiming priority from Great Britain application No. 9804587.5 filed Mar. 4, 1998 assigned to Fujitsu Limited;

ELECTROSTATIC DISCHARGE PROTECTION IN SEMICONDUCTOR DEVICES filed concurrently and claiming priority from Great Britain application No. 9804588.3 filed Mar. 4, 1998 assigned to Fujitsu Limited; and CELL ARRAY CIRCUITRY, U.S. Ser. No. 09/137,837 filed Aug. 21, 1998 and claiming priority from Great Britain application No. 9800367.6 filed Jan. 8, 1998 assigned to Fujitsu Limited.

BACKGROUND OF THE INVENTION

1. Field of the Invention

The present invention relates to thermometer coding circuitry for use, for example, in digital-to-analog converters.

2. Description of the Prior Art

FIG. 1 of the accompanying drawings shows parts of a conventional digital-to-analog converter (DAC) of the so-called "current-steering" type. The DAC 1 is designed to convert an m-bit digital input word (D1–Dm) into a corresponding analog output signal.

The DAC 1 includes a plurality (n) of identical current sources $2_1$ to $2_n$, where $n=2^m-1$. Each current source 2 passes a substantially constant current I. The DAC 1 further includes a plurality of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the differential-switching-circuit first terminals, and a second output current $I_B$ of the DAC 1 is the sum of the respective currents delivered to the differential-switching-circuit second terminals.

The analog output signal is the voltage difference $V_A-V_B$ between a voltage $V_A$ produced by sinking the first output current $I_A$ of the DAC 1 into a resistance R and a voltage $V_B$ produced by sinking the second output current $I_B$ of the converter into another resistance R.

In the FIG. 1 DAC the thermometer-coded signals T1 to Tn are derived from the binary input word D1–Dm by a binary-thermometer decoder 6. The decoder 6 operates as follows.

When the binary input word D1–Dm has the lowest value the thermometer-coded signals T1–Tn are such that each of the differential switching circuits $4_1$ to $4_n$ selects its second terminal so that all of the current sources $2_1$ to $2_n$ are connected to the second connection line B. In this state, $V_A=0$ and $V_B=nIR$. The analog output signal $V_A-V_B=-nIR$.

As the binary input word D1–Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1–Dm has the value i, the first i differential switching circuits $4_1$ to $4_i$ select their respective first terminals, whereas the remaining n-i differential switching circuits $4_{i+1}$ to $4_n$ select their respective second terminals. The analog output signal $V_A-V_B$ is equal to (2i-n)IR.

FIG. 2 shows an example of the thermometer-coded signals generated for a three-bit binary input word D1–D3 (i.e. in this example m=3). In this case, seven thermometer-coded signals T1 to T7 are required ($n=2^m-1=7$).

As FIG. 2 shows, the thermometer-coded signals T1 to Tn generated by the binary-thermometer decoder 6 follow a so-called thermometer code in which it is known that when an rth-order signal Tr is activated (set to "1"), all of the lower-order signals T1 to Tr-1 will also be activated.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

It will be appreciated that the number of current sources 2 and corresponding differential switching circuits 4 in the FIG. 1 architecture is quite large, particularly when m is greater than or equal to 6. When m=6, for example, n=63, and 63 current sources and 63 differential switching circuits are required. In order to deal with such a large number of current sources, and to enable the thermometer signals to be delivered efficiently to the different differential switching circuits, it has been proposed to arrange the current sources and differential switching circuits as a two-dimensional array of cells, each cell including one current source and its associated differential switching circuit. This arrangement is shown in FIG. 3.

In FIG. 3, 64 cells $CL_{ij}$ are arranged in an 8×8 square array having eight rows and eight columns. In FIG. 3, the first digit of the suffix applied to each cell denotes the row in which the cell is located and the second digit of the suffix denotes the column in which the cell is located. Thus, the cell $CL_{18}$ is the cell in row 1, column 8.

Each cell $CL_{ij}$ includes its own current source 2 and its own differential switching circuit 4. The respective first terminals of the cells of the array are connected together to a first connection line A of the DAC and the respective second terminals of the cells of the array are connected together to a second connection line B of the DAC, as in the FIG. 1 DAC.

In order to avoid having to generate and supply different respective thermometer-coded signals to all the cells of the array, a two-stage decoding process is adopted to convert the binary input word D1–D6 into the respective thermometer-coded control signals T required by the differential switching circuits 4 in the different cells. The first stage of this two-stage decoding process is carried out by respective row and column decoders 12 and 14, and the second stage is carried out by a local decoder 16 provided for each cell.

The three lower-order bits D1–D3 of the binary input word are applied to the column decoder 14 which derives therefrom seven thermometer-coded column selection signals in accordance with FIG. 2. The row decoder 12 receives the three higher-order bits D4–D6 of the input word and derives therefrom seven thermometer-coded row selection signals, also in accordance with FIG. 2. The row and column selection signals are distributed to the cells of the array.

In each cell the local decoder 16 combines the row and column selection signals to derive therefrom the required local control signal T for the differential switching circuit 4 of the cell concerned. In practice, the local decoder 16 in each cell does not need to employ all seven row and column selection signals to produce the required local control signal T. This is because, for any digital input word, the rows of the matrix fall into one of three different states: (1) rows in which the respective differential switching circuits of all cells of the row select the second terminal; (2) rows in which the respective differential switching circuits of all cells of the row select the first terminal; and (3) a (unique) row in which the differential switching circuits of one or more cells of the row select the second terminal whereas the differential switching circuits of one or more other cells of the row select the first terminal. In view of these limited possibilities, it is possible for each local decoder to derive its local control signal T simply by combining two of the row selection signals $r_n$ and $r_{n+1}$ and one of the column selection signals $c_n$.

One problem which arises in the FIG. 3 arrangement is that the lines which connect the first and second terminals of the differential switching circuit 4 of each cell to the first and second connection lines A and B (FIG. 1) inevitably experience a significant amount of coupling from the digital row and column selection signals that propagate in orthogonal directions across the array. When the row and column decoders 12 and 14 and local decoder 16 are formed from CMOS circuitry, the row and column selection signals normally change between Vdd and Vss and are single-ended, resulting in substantial coupling to the analog outputs.

BRIEF SUMMARY OF THE INVENTION

According to a first aspect of the present invention, there is provided coding circuitry, for producing a first set of thermometer-coded output signals in dependence upon a binary input signal, wherein, as the input signal increases progressively in value from a first value to a second value, the first-set output signals are activated in a predetermined sequence and, as the input signal increases progressively in value from the said second value to a third value, the first-set output signals are deactivated in a predetermined sequence.

In such circuitry the output signals are not all deactivated when the input-signal value is changed from the second value to the next-highest value. Accordingly, a large glitch is avoided at the second value.

"Activated" in relation to an output signal means that the signal changes from a first logic level to a second logic level. "Deactivation" means that the signal changes from the second logic level to the first logic level. For example the first and second logic levels may be the low logic level "L" (or "0") and "H" (or "1") respectively.

Preferably, when the input-signal value changes from any value to the next-highest value or to the next-lowest value, at most one of the first-set output signals is activated or deactivated. This keeps glitches to a minimum.

It is not necessary for there to be a change in the first-set output signals for every unit change in the input-signal value. For example, in one preferred embodiment, when the input signal decreases in value from the said second value to the next-lowest value, none of the first-set output signals is changed. Such an embodiment can be used, for example, when there is another set of output signals derived from the input signal, which other set undergoes an output-signal change when the input-signal value changes from the second value to the next-lowest value (preferably only one signal of the other set changes at this time).

Preferably, the predetermined activation and deactivation sequences for the first-set output signals are such that the first output signal to be activated in the activation sequence is the last output signal to be deactivated in the deactivation sequence. Alternatively, the activation and deactivation sequences could be the same.

In a preferred embodiment, the coding circuitry is further operable to produce a second set of thermometer-coded output signals in dependence upon the said binary input signal such that, as the input signal increases progressively in value from the said first value to the said second value, the second-set output signals are deactivated in a predetermined sequence and, as the input signal increases progressively in value from the said second value to the said third value, the second-set output signals are activated in a predetermined sequence.

In this case each output signal of the first set can be regarded as having an individually-corresponding output signal of the second set, which two output signals can be delivered as a output-signal pair to a line of circuit elements, e.g. a column in a two-dimensional array of the elements. Even-numbered circuit elements along the column use as their selection signal one output signal of the pair (e.g. the first-set output signal) whereas odd-numbered circuit elements of the column use as their selection signal the other output signal of the pair (e.g. the second-set output signal). This enables the circuit elements in even-numbered rows to be activated in the same sequence as circuit elements in the odd-numbered rows, without the need to supply more than two output signals to each column and without the need for complex further decoding logic associated with each circuit element.

As with the first-set output signals, it is preferable that when the input-signal value changes from any value to the next-highest value or the next-lowest value, at most only one second-set output signal is activated or deactivated. Similarly, when the input signal decreases from the said second value to the next-lowest value, it is possible that none of the second-set output signals is changed, for example, when there is another set of output signals derived from the input signal that undergoes an output-signal change when the input-signal value changes from the second value to the next-lowest value (preferably only one signal of the other set changes at this time).

It is preferable that when the input signal changes from one value to another value the number of output signals that are deactivated in one of the first and second output-signal sets is equal to the number of output signals that are activated in the other of the first and second output-signal sets. This means that the changes in the two sets of output signals cancel one another out for noise purposes.

According to a second aspect of the present invention there is provided cell array circuitry including: a plurality of cells arrayed logically (i.e. not necessarily physically) in rows and columns, each cell of the array having local decoder means connected for receiving a row selection signal corresponding to its row and a column selection signal corresponding to its column, and operable, in dependence upon the received row and column selection signals, to produce a control signal for use in controlling a predetermined operation of the cell; a row decoder for producing the said row selection signals corresponding respectively to the said rows; and a column decoder, comprising coding circuitry embodying the aforesaid first aspect of the present invention, the said column selection signals corresponding respectively to the said columns being provided by the said output signals of the coding circuitry.

In such circuitry the cells of the array can be selected efficiently using only one or two row selection signals per row and one or two column selection signals per column, without the problems associated with a full set of column selection signals changing at certain input-signal values.

The cells may contain any suitable circuitry, for example current sources or current sinks, resistance elements, capacitance elements, mixers etc.

The predetermined operation may be any type of operation of the cell. For example, it could be a switching or selection operation for switching on or off, or controlling the output path of, an (analog) output signal of the cell.

It is not necessary for the local decoder means of each cell to be located with the other circuitry belonging to the cell. For example, the analog circuitry of the cells may be located in a physical array, with the local decoder means (digital circuitry) of the cells located around the periphery of the physical array containing the analog circuitry. This can enable the analog and digital circuitry to be physically separate, so that coupling of noise from the digital circuitry to the analog circuitry is reduced. Also, by concentrating the analog circuitry of different cells in a small area, the physical and electrical conditions of the analog circuitry of different cells can be closely matched.

The local decoder means associated with each cell can have a simple construction (e.g. two logic gates), contributing to low signal propagation delays as well as low cost. It is not necessary for the local decoder means to be located in its associated cell.

Preferably the said row selection signals are also thermometer-coded signals, so as to minimise glitches associated with the row selection. In this case, each cell may also be connected for receiving the row selection signal corresponding to the next row of the array so as to enable the local decoder means to respond to the column selection signal for the cell differently depending on whether or not the row in which the cell is located is the highest-numbered row to be selected.

There may be only one set of column selection signals, in which case each cell only receives one such column selection signal. For example, the array of cells may be regarded as having alternate first and second rows (logically alternate, not necessarily physically alternate). In this case, the local decoder means in first-row cells is different from the local decoder means in second-row cells. For example, the local decoder means in each first-row cell is operable to produce its said control signal when the said row selection signal corresponding to the cell's row and the said column selection signal corresponding to the cell's column are both activated or when the said row selection signal corresponding to the next row is activated. The local decoder means in each second-row cell, on the other hand, is operable to produce its said control signal when the said row selection signal corresponding to the cell's row is activated and the said column selection signal corresponding to the cell's column is deactivated or when the said row selection signal corresponding to the next row is activated.

In the above arrangement, the selection sequence in the first rows is reversed in comparison with the second rows. If it is desired to avoid this reversal, the above-mentioned second set of column selection signals should be produced by the coding circuitry, in addition to the first set. Then, each column can have respective first and second column selection signals corresponding to the column concerned, the first column selection signals corresponding to the different columns being provided respectively by the first-set output signals of the coding circuitry and the second column selection signals corresponding to the different columns being provided respectively by the second-set output signals of the coding circuitry. The cell array can then be regarded as having alternate first and second rows (logically alternate, not necessarily physically alternate). For each column of the array, the local decoder means of first-row cells of the column concerned are connected to receive the said first column selection signal corresponding to the column concerned, and the local decoder means of second-row cells of the column concerned are connected to receive the second column selection signal corresponding to the column concerned. In this case, the selection sequences in the first and second rows are the same, even though each local decoder means only receives one column selection signal. If the cells are arrayed physically (as well as logically) in rows and columns, the distribution of selection signals is still convenient as only two column selection signals per column are required.

The logic required in the local decoder means of each cell is desirably simple and can be the same for all cells (both first-row cells and second-row cells), simplifying the design. For example, the said local decoder means in each cell is operable to produce its said control signal when the said row selection signal corresponding to the cell's row and the said column selection signal corresponding to the cell's column are both activated or when the said row selection signal corresponding to the next row of the array is activated.

In a preferred embodiment, the row decoder is connected for receiving a first portion (e.g. two or more most-significant bits) of a binary input-word signal applied to the cell array circuitry and produces the said row selection signals in dependence upon the first portion, and the said column decoder is connected for receiving a second portion (e.g. two or more least-significant bits) of that binary input-word signal, which portion constitutes the said binary input signal of the said coding circuitry. In this way, a single binary input word can be used conveniently to select the cells of the array. For example, when the input word has the value i, the first i cells of the array are selected.

According to a third aspect of the present invention there is provided a digital-to-analog converter including cell array circuitry embodying the aforesaid second aspect of the invention, wherein each of the said cells comprises a current source or current sink and a switch circuit having an input connected to the current source/sink of the cell and also having respective first and second outputs, and operable selectively, in dependence upon the said control signal, to connect its said input to its said first output or to its said second output.

According to a fourth aspect of the present invention there is provided coding circuitry, for producing thermometer-coded output signals in dependence upon binary input signals, including: first coding means connected for receiving a first binary input signal and operable to derive therefrom a first set of thermometer-coded output signals; second coding means connected for receiving a second binary input signal and operable to derive therefrom a second set of thermometer-coded output signals; and third coding means connected for receiving a third binary input signal and operable to derive therefrom a third set of thermometer-coded output signals.

In such coding circuitry the three sets of output signals can enable a small total number of output signals to be used to select circuit elements of a large array (logical array, not necessarily physical) using desirably simple logic. The propagation delays associated with the coding circuitry can be desirably uniform and short.

The first, second and third binary input signals may be provided from different respective sources. Preferably, however, at least two, and more preferably all three, of the said first, second and third binary input signals are derived from a common input-word signal. It is convenient to be able to select circuit elements from a single input signal. For example, the first, second and third binary input signals may be derived from different respective portions (e.g. most-significant, middle-order, and least-significant bits) of the said common input-word signal.

The output-signal sets may embody conventional thermometer codes. However, the output-signal set derived by at least one of the said first, second and third coding means is preferably a smoothed output-signal set of the type produced by coding circuitry embodying the aforesaid first aspect of the invention. This reduces glitches associated with the selection signals of a set all changing at certain input-signal values.

Further, the or each coding means that derives such a smoothed output-signal set is also preferably operable to derive two such smoothed sets of the thermometer-coded output signals. This has advantages in ensuring consistency in the selection sequences of different lines of the circuit elements.

According to a fifth aspect of the present invention there is provided cell array circuitry including: a plurality of cells arrayed logically (not necessarily physically as well) in respective first, second and third dimensions (e.g. row, column and depth directions), each cell of the array having local decoder means connected for receiving a first-dimension selection signal (e.g. a row selection signal) corresponding to its first-dimension position in the array and a second-dimension selection signal (e.g. a column selection signal) corresponding to its second-dimension position in the array and a third-dimension selection signal (e.g. a depth selection signal) corresponding to its third-dimension position in the array, and operable, in dependence upon the received selection signals, to produce a control signal for use in controlling a predetermined operation of the cell; and coding circuitry embodying the aforesaid fourth aspect of the present invention, the said first-dimension, second-dimension and third-dimension selection signals being provided by the said first, second and third output-signal sets respectively.

Each cell is preferably also connected for receiving the row selection signal corresponding to the next row of the array and the column selection signal corresponding to the next column of the array. This can enable the local decoder means to respond to the column selection signal for its cell differently depending on whether or not the row in which the cell is located is the highest-numbered row to be selected, and to respond to the depth selection signal for its cell differently depending on whether or not the column in which the cell is located is the highest-numbered column to be selected.

Preferably, the third coding means in the coding circuitry are operable to produce two such smoothed output-signal sets serving to provide, for each third-dimension position, a first third-dimension selection signal corresponding to that position and a second third-dimension selection signal corresponding to that position. In this case, the cell array can be considered as having alternate (logically alternate, not necessarily physically alternate) first and second second-dimension positions. For each third-dimension position, the local decoder means of cells at the first second-dimension positions are connected to receive the said first third-dimension selection signal corresponding to the third-dimension position concerned, and the local decoder means of cells at the second second-dimension positions are connected to receive the said second third-dimension selection signal corresponding to the third-dimension position concerned. This enables the selection sequences in the second-dimension lines (e.g. the columns) to be the same.

Alternatively, or in addition, the said second coding means in the coding circuitry are operable to produce two such smoothed output-signal sets serving to provide, for each second-dimension position, a first second-dimension selection signal corresponding to that position and a second second-dimension selection signal corresponding to that position. In this case, the cell array can be regarded as having alternate first and second first-dimension positions. For each second-dimension position, the local decoder means of cells at the first first-dimension positions are connected to receive the said first second-dimension selection signal corresponding to the second-dimension position concerned, and the local decoder means cells at the second first-dimension positions are connected to receive the said second second-dimension selection signal corresponding to the second-dimension position concerned. This enables the selection sequences in the first-dimension lines (e.g. the rows) to be the same.

According to a sixth aspect of the present invention there is provided a digital-to-analog converter including cell array circuitry embodying the aforesaid fifth aspect of the present invention, wherein each of the said cells comprises a current source or current sink and a switch circuit having an input connected to the current source/sink of the cell and also having respective first and second outputs, and operable selectively, in dependence upon the said control signal, to connect its said input to its said first output or to its said second output.

Embodiments of the aforesaid third or sixth aspect of the present invention can provide a current-steered DAC in which glitches in the analog output signal are reduced highly effectively.

The current source/sink circuits of the cells may be located together in a physical array, with the local decoder means and switch circuits located separately from the physical array, e.g. as peripheral circuits, so as to isolate the analog and digital circuitry and thereby improve noise immunity. Also, by concentrating the current source/sink circuits together in one place it is possible to improve the matching between the closely-proximate source/sink circuits.

The DAC may be of the fully or partially segmented type, in which case the respective current sources/sinks of the said cells source/sink identical currents. Alternatively, the currents sourced/sunk by different cells may be different from one another.

One of the first and second outputs of each switch circuit may be connected to a fixed-potential line such as ground, the other switch-element outputs being connected in common to a summing path of the converter. However, in a preferred embodiment the respective first outputs of the cells are connected together to a first summing path of the converter and the respective second outputs of the cells are connected together to a second summing path of the converter. In this type of DAC the analog output signal of the converter is of the differential type which has advantages in terms of connecting the DAC to further circuitry for processing the analog output. For example, the differential output signal can be delivered by long signal lines to a transformer or the like without significant noise-related problems.

BRIEF DESCRIPTION OF THE DRAWINGS

FIG. 4 shows schematically an array of cells in a DAC according to a first embodiment of the present invention;

FIG. 9 presents a table showing row and column selection signals produced by the FIG. 6 input circuitry in response to different values of a binary input word;

FIG. 16 presents a table showing respective row, column and depth selection signals produced by the FIG. 12 input circuitry in response to different values of a binary input word.

DETAILED DESCRIPTION OF THE PREFERRED EMBODIMENTS

Figure 5:
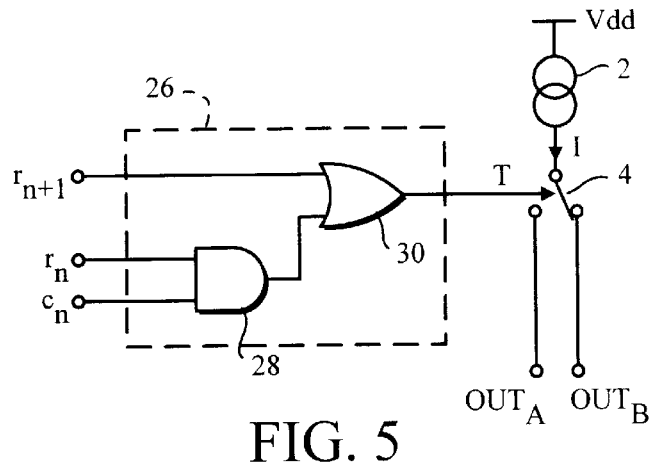
FIG. 5 shows an example constitution of one of the cells in the FIG. 4 cell array.

FIG. 4 shows an arrangement of cells in eight rows and eight columns, suitable for use in a DAC according to a first embodiment of the present invention. As shown in FIG. 5, each cell includes a current source 2 and a differential switching circuit 4 which, in accordance with a control signal T applied to it, selects either to deliver the current I generated by the current source 2 to a first output terminal $OUT_A$ of the cell or to a second output terminal $OUT_B$ of the cell. The respective output terminals $OUT_A$ of the different cells are connected together to a first summing path (not shown) and the respective output terminals $OUT_B$ of the different cells are also connected together to a second summing path (not shown).

Incidentally, the numbers allocated to the cells in FIG. 4 denote the order in which the cells are caused to change from selecting their respective second output terminals to selecting their respective first output terminals as the binary input word of the DAC increases in value. For example, when the input word has the value 13, the first 14 cells (0 to 13) select their first output terminals and the remaining cells (14 to 63) select their second output terminals. Cell 0 always selects its first output terminal in this embodiment.

Each cell further comprises a local decoder 26 which, in this embodiment, comprises a two-input AND gate 28 and a two-input OR gate 30. The local decoder 26 of the cell receives first and second row signals $r_{n+1}$ and $r_n$ and a column signal $c_n$.

The two row signals $r_{n+1}$ and $r_n$ and the column signal $c_n$ applied to the local decoder 26 of each cell are provided by a set of "normal" thermometer-coded row selection signals ROW 0~6 and by two sets of "smoothed" thermometer-coded column selection signals COL A~6 and COL B0~6, as shown schematically in FIG. 4.

Dealing firstly with the rows, all eight cells in any particular row of the cell array receive the same two row signals $r_n$ and $r_{n+1}$. The thermometer-coded row selection signals ROW 0 to ROW 6 correspond respectively to rows 0 to 6 of the FIG. 4 cell array.

In each of rows 0 to 6 the cells of the row receive, as the first row signal $r_{n+1}$, the row selection signal corresponding to the row concerned. The first row signal $r_{n+1}$ for the cells of row 7 is simply set permanently to logic level "0".

In each of rows 1 to 7, the cells of the row also receive, as the second row signal $r_n$, the row selection signal corresponding to the preceding row of the cell array. In the case of row 0, the second row signal $r_n$ for all of the cells of the row is simply set permanently to logic level "1".

For example, as shown in FIG. 4, the eight cells numbered 16 to 23 of row 2 each receive as the first row signal $r_{n+1}$ the row selection signal ROW 2 corresponding to that row and receive as the second row signal $r_n$ the row selection signal ROW 1 corresponding to the preceding row 1 of the cell array.

In the column direction, as shown in FIG. 4 there are two sets of thermometer-coded column selection signals COL A and COL B. Each of columns 1 to 7 has a corresponding COL A selection signal and a corresponding COL B selection signal. For example, column 1 has a first corresponding column selection signal COL A0 and a second corresponding column selection signal COL B0.

Within each column, the cells of the even-numbered rows (row 0, 2, 4 and 6) receive as the column signal $c_n$ the corresponding COL A selection signal, whereas the cells in odd-numbered rows of the column receive as the column signal $c_n$ the corresponding COL B selection signal. By way of example, FIG. 4 shows the column signals $c_n$ for the different cells of column 2 (cells 2, 10, 18, 26, 34, 42, 50 and 58). For each of the cells in the even-numbered rows (cells 2, 18, 34 and 50), $c_n$=COL A1, whereas for each of the cells in the odd-numbered rows (10, 26, 42 and 58) $c_n$=COL B1.

The cells of column 1 each have the column signal $c_n$ set permanently to logic "1".

Figure 6:
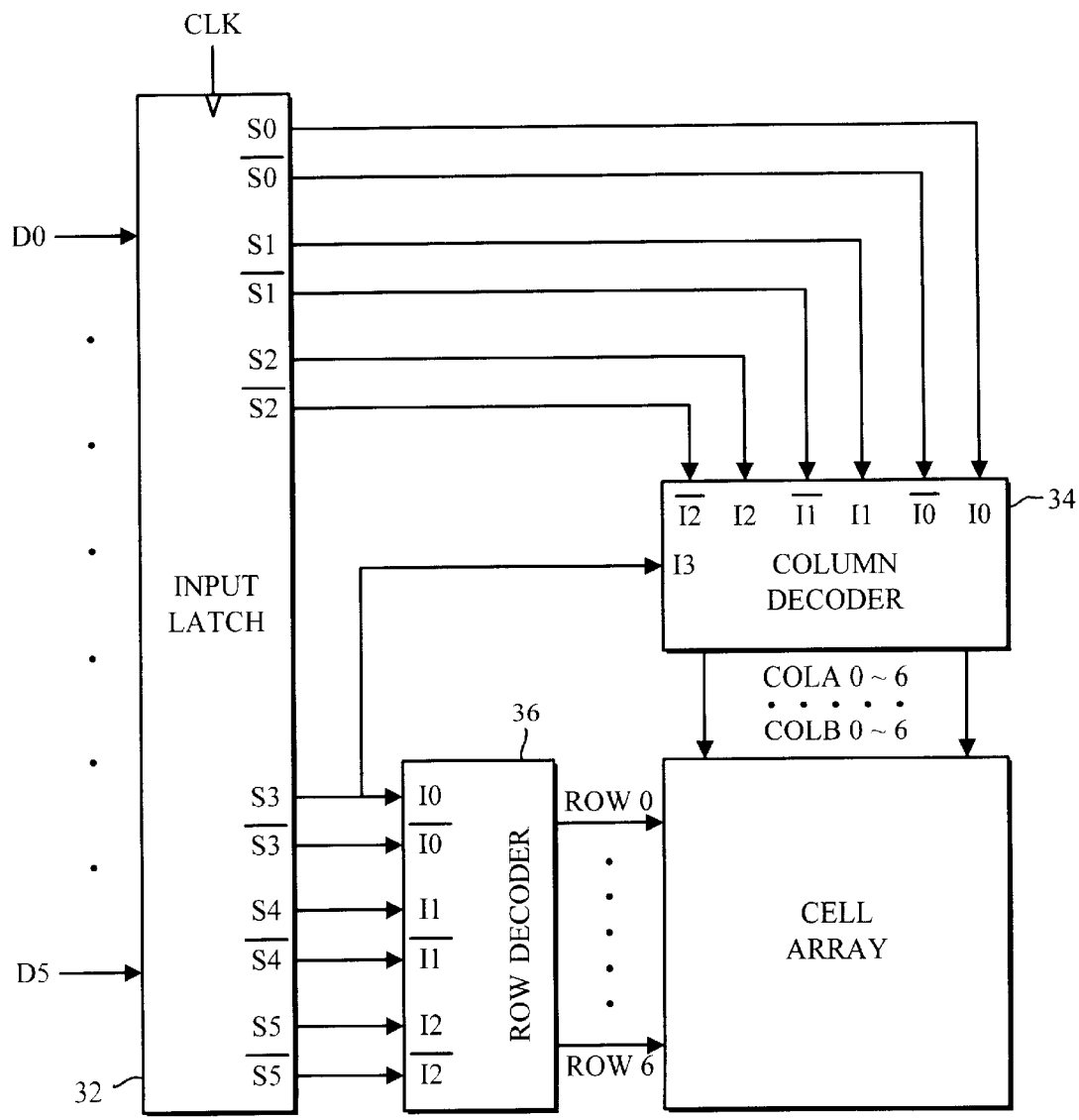
FIG. 6 shows parts of input circuitry of a DAC according to the first embodiment.

Referring next to FIGS. 6–9, the way in which the row selection signals ROW 0 to ROW 6 and the two sets of column selection signals COL A and COL B are generated will now be described. As shown in FIG. 6, the DAC according to the first embodiment comprises an input latch 32 to which a six-bit binary input word D0–D5 is applied. The input latch 32 latches each bit D0 to D5 of the binary input word in dependence upon a clock signal CLK applied to the latch 32. The latch has six pairs of mutually-complementary outputs S0, $\overline{S0}$ S1, $\overline{S1}$, . . . S5, $\overline{S5}$ corresponding respectively to the different bits D0 to D5 of the binary input word.

The three lower-order outputs S0/$\overline{S0}$, S1/$\overline{S1}$ and S2/$\overline{S2}$ are connected to respective complementary inputs I0/$\overline{I0}$, I1/$\overline{I1}$ and I2/$\overline{I2}$ of a column decoder 34. A further input I3 of the column decoder 34 is connected to the output S3 of the input latch 32.

The three higher-order outputs S3/$\overline{S3}$, S4/$\overline{S4}$ and S5/$\overline{S5}$ are applied to respective complementary inputs I0/$\overline{I0}$, I1/$\overline{I1}$ and I2/$\overline{I2}$ of a row decoder 36.

The construction and operation of the column decoder 34 will now be explained with reference to FIGS. 7(A) to 7(C).

Figure 7A:
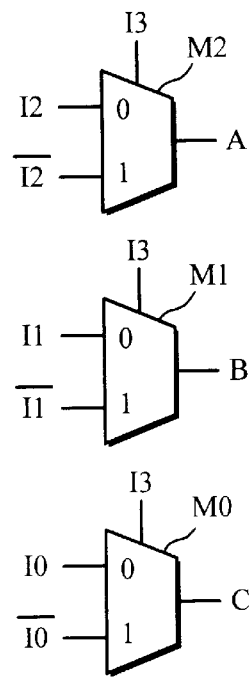
FIGS. 7(A) to 7(C) show examples of the constitution of a column decoder in the FIG. 6 input circuitry.

As shown in FIG. 7(A) each pair of complementary inputs of the column decoder 34 is connected to a different multiplexer M0 to M2. A selection input of each multiplexer M0 to M2 is connected to the I3 input of the column decoder 34. The multiplexer M0 produces an output signal C, the multiplexer M1 produces an output signal B, and the multiplexer M2 produces an output signal A.

In operation of the column decoder 34, each multiplexer M0 to M2 selects one of its two complementary inputs according to the value of the signal applied to the I3 input of the column decoder 34. For example, the multiplexer M0 selects the I0 input when the I3 input is 0 and selects the $\overline{I0}$ input when the I3 input is 1. The signal at the selected input is delivered by the multiplexer M0 as the output signal C thereof. The multiplexers M1 and M2 function in a similar manner to the multiplexer M0.

Figure 7B:
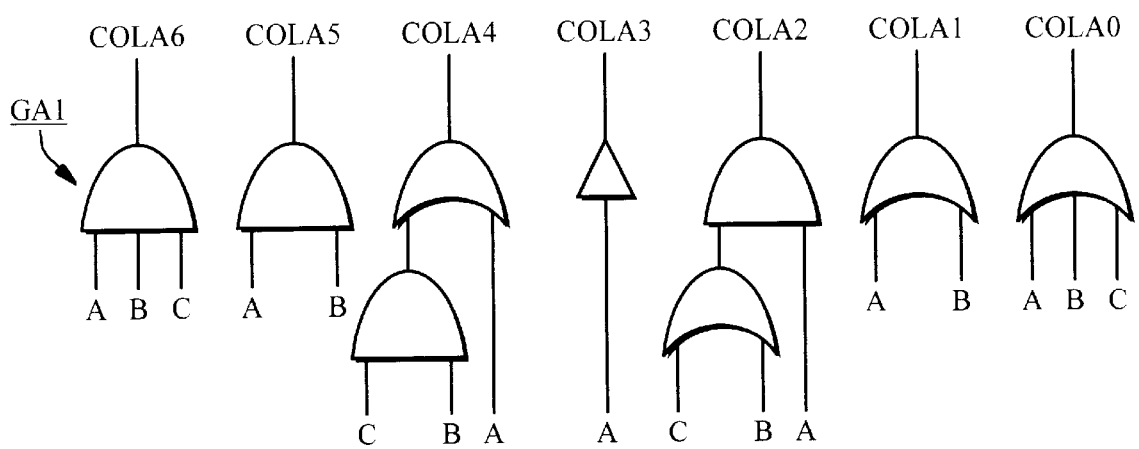

The first set of column selection signals COL A0 to COL A6 is generated by a first group of gates GA1 as shown in FIG. 7(B). For example, the column selection signal COL A0 is generated by a three-input OR gate which produces the logical-OR of the output signals A to C of the multiplexers.

Figure 7C:
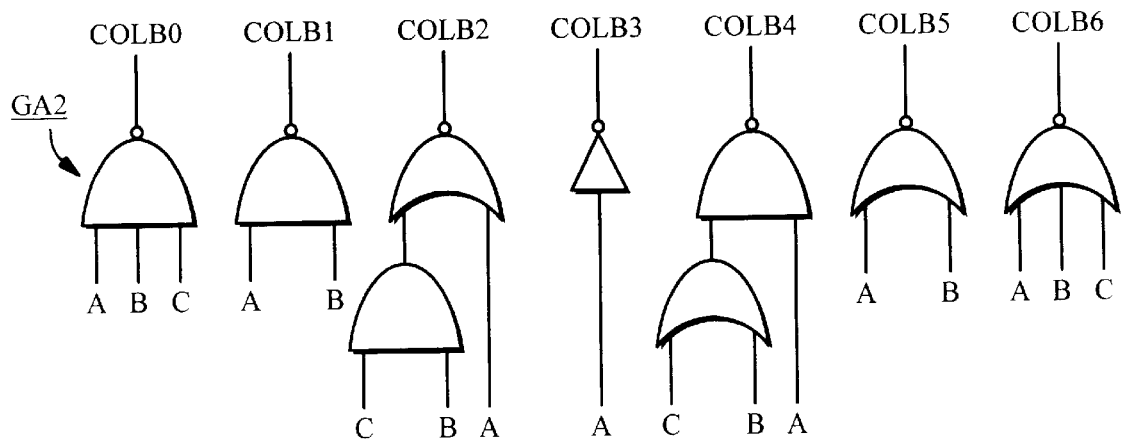

The second set of column selection signals COL B0 to COL B6 is generated by a second group of gates GA2 as shown in FIG. 7(C). For example, the column selection signal COL B0 is generated by a three-input NAND gate which produces the logical-NAND of the output signals A to C of the multiplexers M0 to M2.

Figure 8:
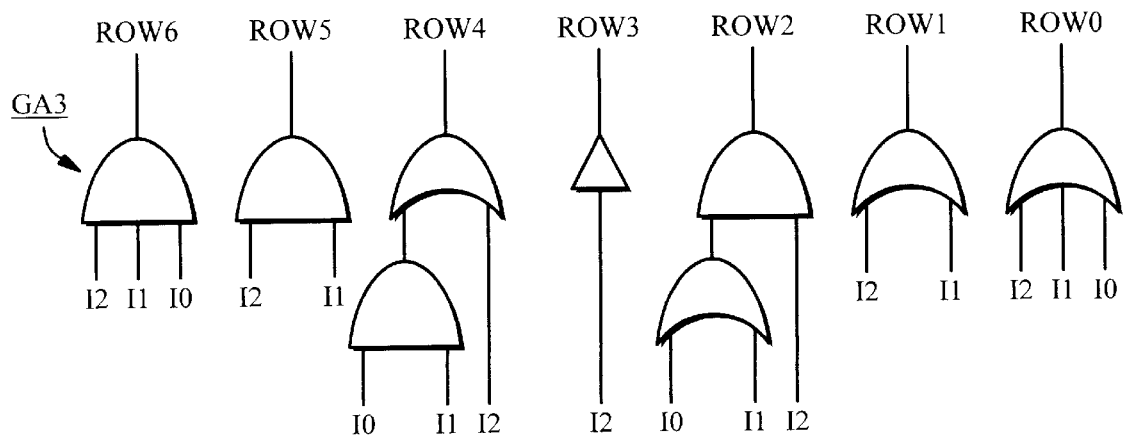
FIG. 8 shows an example constitution of a row decoder in the FIG. 6 input circuitry.

The row decoder 36 of FIG. 6 is implemented by circuitry similar to the column decoder 34. However, as shown in FIG. 8, in this case only a group of gates GA3 corresponding to the first group of gates GA1 (FIG. 7(B)) of the column decoder 34 is required, which gates GA3 are driven directly by the signals S3–S5 received respectively at the I0–I2 inputs of the row decoder. The multiplexers M0 to M2 (FIG. 7(A)) and the second set of gates GA2 (FIG. 7(C)) of the column decoder 34 are not required for the row decoder 36.

FIG. 9 presents a table showing the row selection signals and column selection signals produced by the row and column decoders 34 and 36 of FIG. 6. It can be seen from FIG. 9 that, whereas the row selection signals ROW 0~6 are thermometer-coded in the normal (conventional) manner, each set COL A0~6 and COL B0~6 of column selection signals is thermometer-coded in a modified or smoothed manner such that there is no return to zero after a full-scale value (e.g. see COL A when the input-word value changes from 7 to 8).

In the conventional row-and-column (two dimensional) thermometer coding technique, on the other hand, only one set of normally-coded column selection signals is used and these column selection signals change from being all 1's to being all 0's whenever there is a change in the row selection signals, e.g. when the input word changes from 7 to 8. This leads to eight signals being changed (all of the column selection signals and one of the row selection signals) simultaneously, giving rise to significant coupling from the digital selection signals to the analog outputs of the cells.

Referring to FIG. 9 it can be seen that when the input word changes by 1, at most only one of the row selection signals changes. When such a row-selection-signal change occurs, there is no change in either set of column selection signals COL A or COL B—see for example input codes 7 and 8 which produce the same column selection signals COL A and COL B.

Similarly, for other increases of 1 in the value of the input word, none of the row selection signals ROW 0 to ROW 6 changes and at most only one signal in each of the sets COL A and COL B of column selection signals changes—see for example the change in input word from 3 to 4.

It will also be appreciated from comparing the COL A and COL B sequences in FIG. 9 that whenever the input-word value changes, such that one or more column selection signals of COL A change, the same number of column selection signals of COL B undergo changes complementary to the COL A changes. The equal numbers of complementary changes cancel one another out, such that the noise effect on the power supply is minimised. Thus, even though the use of the two sets of column selection signals COL A and COL B means that there are 21 selection signals in total to distribute to the different cells, the effective noise level corresponds only to 7 signals (the number of row selection signals) because the two sets of column selection signals cancel one another out for noise purposes.

It will be understood that when using a smoothed set COL A of column selection signals it is not necessary to provide the second set COL B of column selection signals in every embodiment. For example, it would be possible to provide local decoders in the cells of the odd-numbered rows, 1, 3, 5 and 7 that are different from the local decoders 26 (FIG. 5) provided in the cells of the even-numbered rows 0, 2, 4 and 6. In this case, all cells of a column would receive the corresponding COL A selection signal but instead of performing the logical function $T=r_{n+1}+(r_n \cdot c_n)$, the local decoders in the cells of odd-numbered rows would perform the logical function $T=r_{n+1}+(r_n \cdot \overline{c_n})$. In this case, the order of the cells in the even-numbered rows is as shown in FIG. 4, but in the odd-numbered rows the order of the cells is reversed. Thus, for example, in row 1 the order of the cells from left to right would be 15, 14, 13, 12, 11, 10, 9, 8. This order reversal, however, poses no practical problems. In terms of "noise level", however, such an approach is equivalent to 14 signals. Nonetheless, there is still the advantage that not more than one of the row and column selection signals changes in response to a change of one in the value of the input word.

It will also be understood that although the cells are shown in FIG. 4 as being arrayed physically in rows and columns, it is not essential that such a row-and-column physical arrangement be used, and only a "logical" row-and-column arrangement is necessary. For example, the eight rows could be spaced apart or staggered or even laid out end-to-end.

It will be seen that the worst-case propagation delay (as between the outputs of the input latch 32 and the control signal T of a cell) in the first embodiment corresponds to four individual gate delays. For example the row selection signal COL A4 is produced by two series-connected gates of the gate group GA1 (FIG. 7(B)), and the local decoder 26 in each cell of column 5 that is responsive to COL A4 also contains two series-connected gates 28 and 30 (FIG. 5).

Figure 10:
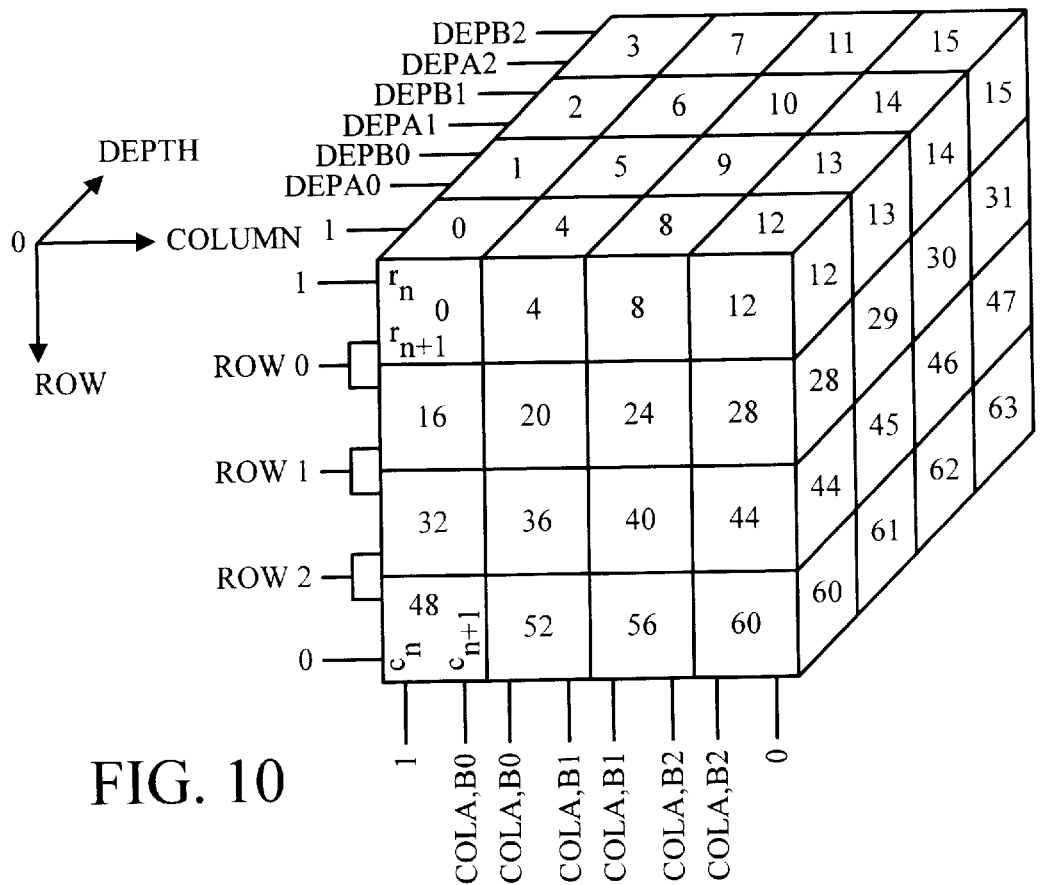
FIG. 10 shows schematically an array of cells in a DAC according to a second embodiment of the present invention.

FIG. 10 shows a three-dimensional array of cells for use in a DAC according to a second embodiment of the present invention. In this embodiment there are again 64 cells in total, arranged in a 4×4×4 cubic array. Thus, from front to back (depth direction) there are 4 row 0's, 4 row 1's, 4 row 2's and 4 row 3's; and 4 column 0's, 4 column 1's, 4 column 2's and 4 column 3's. From front to back (depth direction) there are 4 layers of square cell arrays. Again, the numbers allocated to the cells in FIG. 10 denote the order in the cells change their output-terminal selections as the DAC input word increases progressively.

Figure 11:
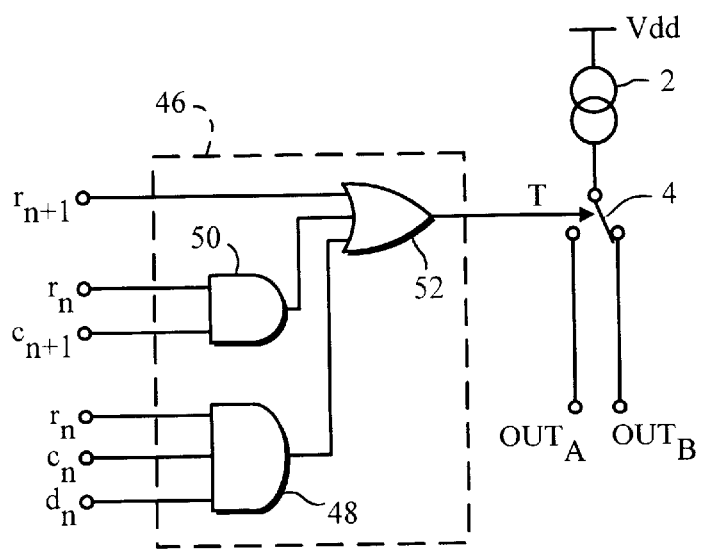
FIG. 11 shows an example constitution of one of the cells in the FIG. 10 cell array.

The constitution of each of the cells in the FIG. 10 array is shown in FIG. 11.

In FIG. 11, the current source 2 and differential switching circuit 4 are the same as in FIG. 5 (first embodiment) but the local decoder 46 in FIG. 11 differs from the local decoder 26 in FIG. 5.

The local decoder 46 in FIG. 11 comprises a three-input OR gate 52, a first input of which receives a first row signal $r_{n+1}$ for the cell concerned. A second input of the OR gate 52 is connected to the output of a two-input AND gate 50 which receives at one input a second row signal $r_n$ and at the other input a first column signal $c_{n+1}$. The third input of the OR gate 52 is connected to the output of a three-input AND gate 48 which receives at its first input the aforementioned second row signal $r_n$ and at its second input a second column select signal $c_n$ and at its third input a depth signal $d_n$.

The derivation of the row, column and depth signals for each cell will now be explained with reference to FIG. 10. In this embodiment there is one "normal" set of row selection signals ROW 0~2, two "smoothed" sets COL A0~2 and COL B0~2 of column selection signals, and two "smoothed" sets DEP A0~2 and DEP B0~2 of depth selection signals.

For the cells in any row 0, i.e. cells 0 to 15, the second row signal $r_n$ is simply set permanently to logic 1 and the first row signal $r_{n+1}$ is provided by a row selection signal ROW 0 corresponding to row 0 of the array. For the cells of any row 1 of the array, i.e. cells 16 to 31, the second row signal $r_n$ is provided by the row selection signal ROW 0 corresponding to the preceding row 0 of the array and the first row signal $r_{n+1}$ is provided by a row selection signal ROW 1 corresponding to row 1 of the array. For the cells of any row 2 (cells 32 to 47) $r_n$=ROW 1 and $r_{n+1}$ is provided by a row selection signal ROW 2 corresponding to row 2 of the array. Finally, for the cells of any row 3 (cells 48 to 63) $r_n$=ROW 2 and $r_{n+1}$=0.

For the cells of any column 0 (cells 0 to 3, 16 to 19, 32 to 35 and 48 to 51) the second column signal $c_n$ is set permanently to logic 1 and the first column signal $c_{n+1}$ is provided by a first-set column selection signal COL A0 if the cell is in an even row and by a second-set column selection signal COL B0 if the cell is in an odd-numbered row. For the cells of any column 1 (cells 4 to 7, 20 to 23, 36 to 39 and 52 to 55) the second column signal $c_n$ is provided by COL A0 if the cell is in an even-numbered row and by COL B0 if the cell is in an odd-numbered row. The first column signal $c_{n+1}$ is provided by a first-set column selection signal COL A1 if the cell is in an even-numbered row and by a second-set column selection signal COL B1 if the cell is in an odd-numbered row. For cells in any column 2 (cells 8 to 11, 24 to 27, 40 to 43 and 56 to 59), the second column signal $c_n$ is provided by COL A1 if the cell is in an even-numbered row and by COL B1 if the cell is in an odd-numbered row. The first column signal $c_{n+1}$ is provided by a first-set column selection signal COL A2 if the cell is in an even-numbered row and by a second-set column selection signal COL B2 if the cell is in an odd-numbered row. Finally, for the cells in any column 3 (cells 12 to 15, 28 to 31, 40 to 47 and 60 to 63) the second column signal $c_n$ is provided by COL A2 if the cell is in an even-numbered row and by COL B2 if the cell is in an odd-numbered row, and the first column signal $c_{n+1}$ is simply set to logic 0.

For cells in layer 0 (cells 0, 4, 8, 12, 16, 20, 24, 28, 32, 36, 40, 44, 48, 52, 56 and 60) the depth signal $d_n$ is simply set to logic 1. For the cells in layer 1 (cells 1, 5, 9, 13, 17, 21, 25, 29, 33, 37, 41, 45, 49, 53, 57 and 61) the depth signal $d_n$ is provided by a first-set depth selection signal DEP A0 if the cell is in an even-numbered column and by a second-set depth selection signal DEP B0 if the cell is in an odd-numbered column. For cells in layer 2 (cells 2, 6, 10, 14, 18, 22, 26, 30, 34, 38, 42, 46, 50, 54, 58 and 62) the depth signal $d_n$ is provided by a first-set depth selection signal DEP A1 if the cell is in an even-numbered column and by a second-set depth selection signal DEP B1 if the cell is in an odd-numbered column. Finally, for cells in layer 3 (cells 3, 7, 11, 15, 19, 23, 27, 31, 35, 39, 43, 47, 51, 55, 59 and 63) the depth signal $d_n$ is provided by a first-set depth selection signal DEP A2 if the cell is in an even-numbered column and by a second-set depth selection signal DEP B2 if the cell is in an odd-numbered column.

Figure 12:
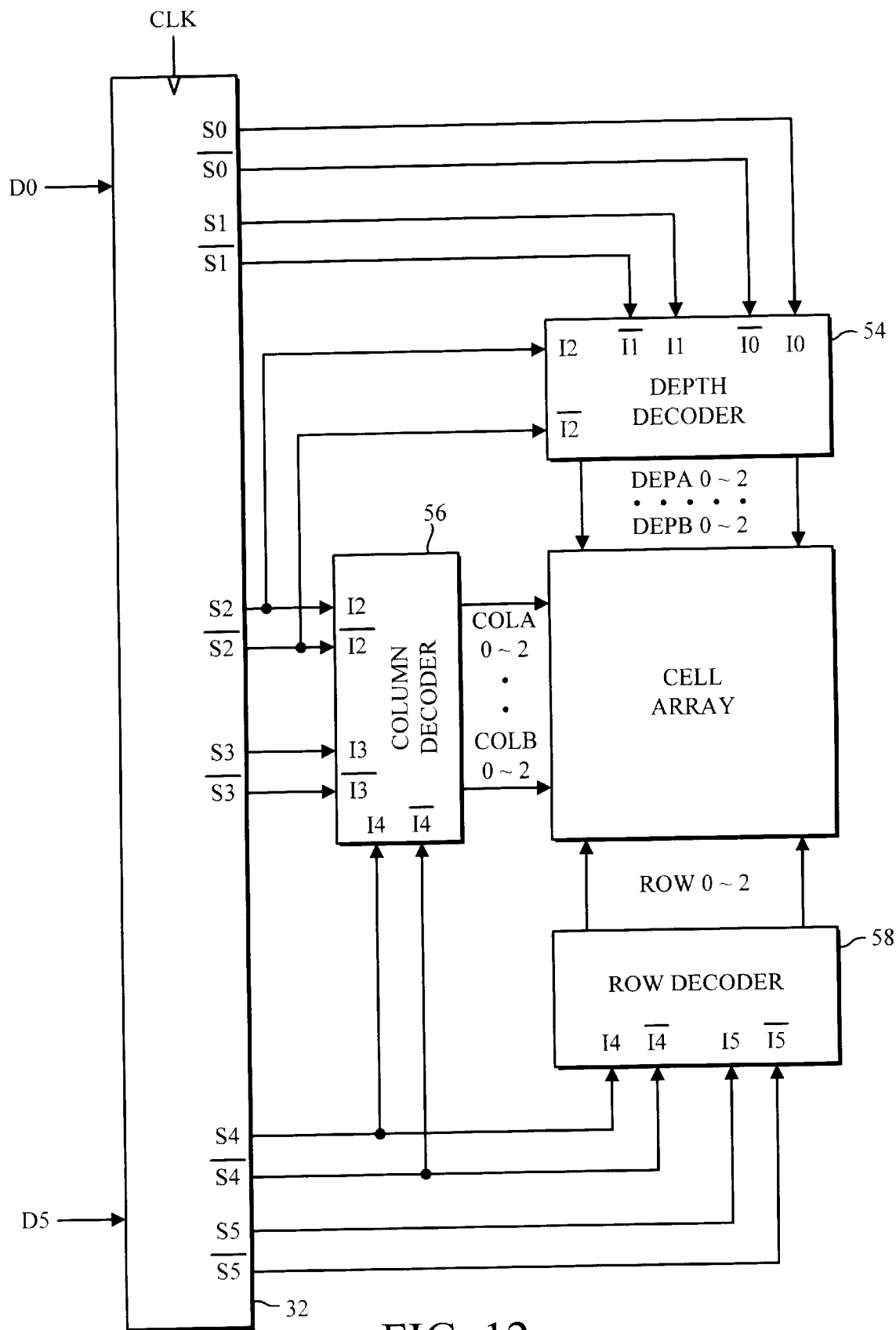
FIG. 12 shows parts of input circuitry of a DAC according to the second embodiment.

FIG. 12 shows decoder circuitry for use in producing the row, column and depth selection signals ROW 0 to ROW 2, COL A0 to COL A2, COL B0 to COL B2, DEP A0 to DEP A2 and DEP B0 to DEP B2. The decoder circuitry of FIG. 12 includes an input latch 32 that is constructed and functions in the same way as the input latch 32 of the first embodiment (FIG. 6). In place of the row and column decoders 36 and 34 of the first embodiment (FIG. 6), however, the decoder circuitry of FIG. 12 includes a depth decoder 54, a column decoder 56 and a row decoder 58.

Figure 13:
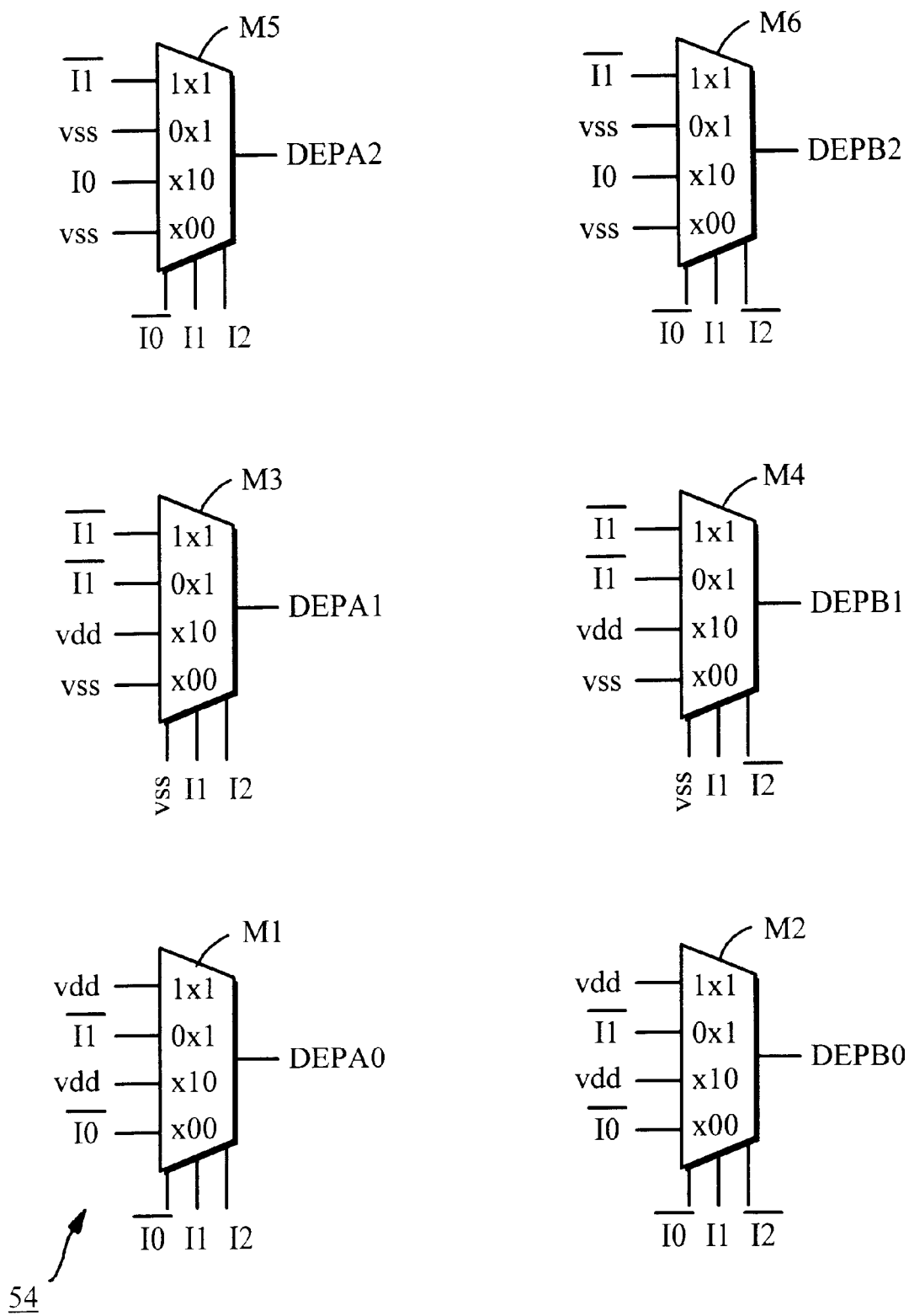
FIG. 13 shows an example constitution of a depth decoder in the FIG. 12 input circuitry.
Figure 14:
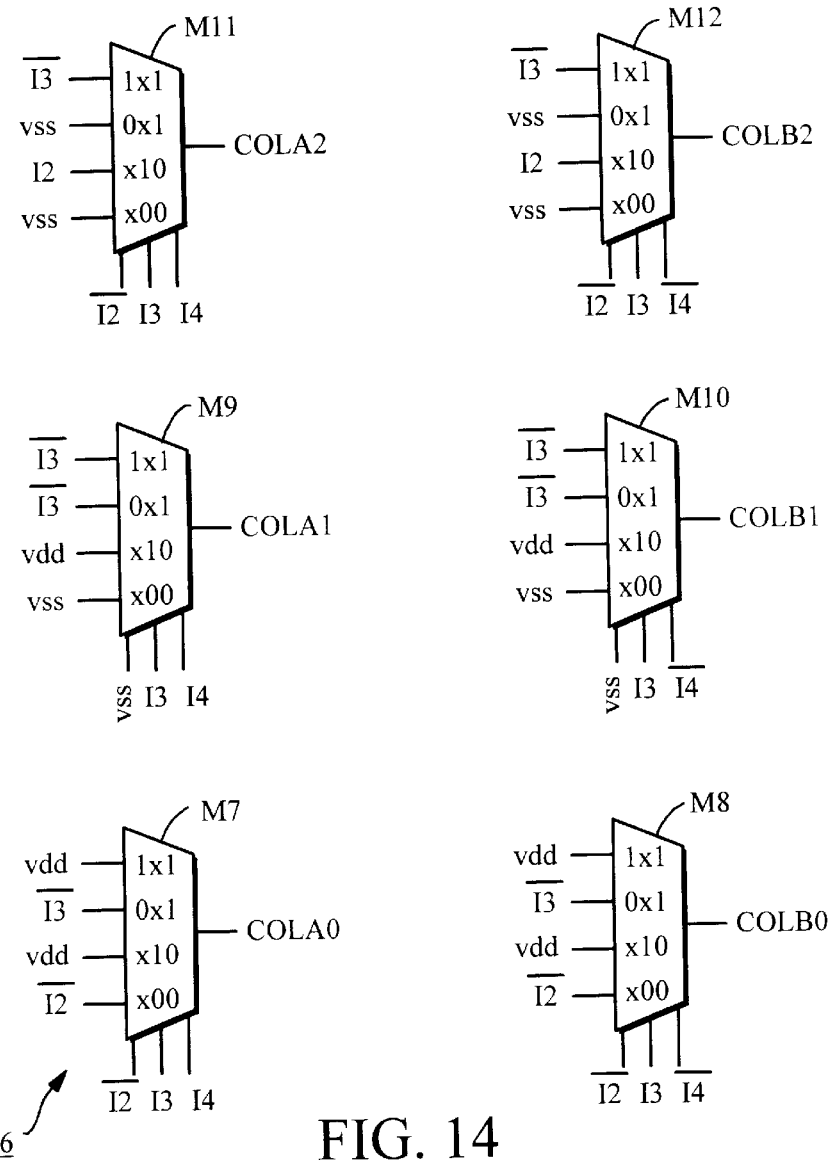
FIG. 14 shows an example constitution of a column decoder in the FIG. 12 input circuitry.
Figure 15:
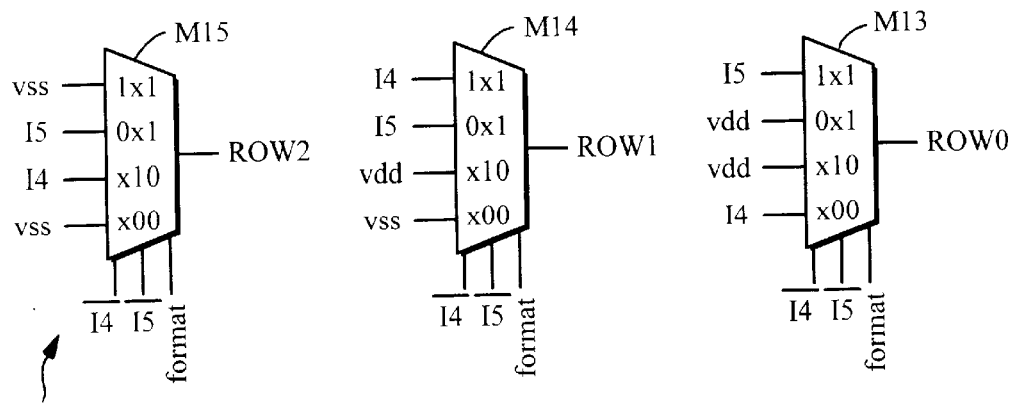
FIG. 15 shows an example constitution of a row decoder in the FIG. 12 input circuitry.

FIG. 13 shows one example of the possible implementation of the depth decoder 54 of FIG. 12. In this example, the depth decoder 54 is implemented by six four-input multiplexers M1 to M6. Each multiplexer M1 to M6 has three selection inputs and selects one of its four inputs in accordance with the signals applied to the three selection inputs. In FIGS. 13 to 15, "x" in relation to a particular selection input denotes a "don't care" state in which the selection input concerned can be either 1 or 0.

FIG. 14 shows one possible implementation of the column decoder 56 of FIG. 12. Again, the column decoder in this implementation is constituted by six four-input multiplexers M7 to M12.

FIG. 15 shows one possible implementation of the row decoder 58 of FIG. 12. In this implementation, the row decoder is provided by three four-input multiplexers M13 to M15. Each of the multiplexers M13 to M15 in FIG. 15 is shown to receive at one of its three selection inputs a "format signal". This format signal is used to denote whether the binary input word D0 to D5 is in unsigned binary or in two's complement notation. The use of such a format signal is an optional feature.

In the depth, column and row decoders 54, 56 and 58 shown in FIGS. 13 to 15, because the multiplexers M1 to M15 are used to generate the row, column and depth selection signals based on the complementary signals from the input latch 32, there is a uniform propagation delay between the input latch and these selection signals, provided that the latch outputs are appropriately sized for their respective loads.

FIG. 16 presents a table showing the ROW, COL A, COL B, DEP A, and DEP B selection signals produced by the decoders 54, 56 and 58 of FIG. 12 in response to different values of the input word D5–D0. Again, as is apparent from FIG. 16, when the input-word value changes by 1, the maximum number of selection signals that change is two. Whenever a change of 1 in the input-word value brings about a change in the depth selection signals DEP A and DEP B, none of the row selection signals ROW and none of the column selection signals COL A and COL B changes. Furthermore, whenever a change of 1 in the input-word value brings about a change in the column selection signals COL A and COL B, none of the row selection signals changes and none of the DEP A and DEP B selection signals changes. Also, when a change of 1 in the input-word value brings about a change in one of the row selection signals, none of the COL A and COL B selection signals changes and none of the DEP A and DEP B selection signals changes.

The thermometer coding technique used in the second embodiment is also highly efficient in terms of the total number of selection signals required: only 15 as compared with 21 in the first embodiment. In addition, since the COL A and COL B signals undergo respective complementary changes, as do the selection signals DEP A and DEP B, the net noise level imposed on the power supply is equivalent to just three selection signals (the number of row selection signals). The maximum number of series-connected gates involved in the decoding process is only three in the second embodiment, contributing to high-speed operation.

In the second embodiment, it is possible to produce just one set of "smoothed" column selection signals (e.g. COL A) and one set of "smoothed" depth selection signals (e.g. DEP A) instead of two sets. In this case, the local decoders 46 (FIG. 11) in different cells must have different logic according to whether they are in odd or even columns and whether they are in odd or even rows. The noise-cancellation advantage of using two sets of selection signals for the column and depth directions is lost in this case, but the number of signals requiring distribution is reduced to just nine. The order of the cells in the cubic array may be reversed in some columns or rows in this case, for reasons analogous to those given in relation to the first embodiment.

Figures 1, 2:
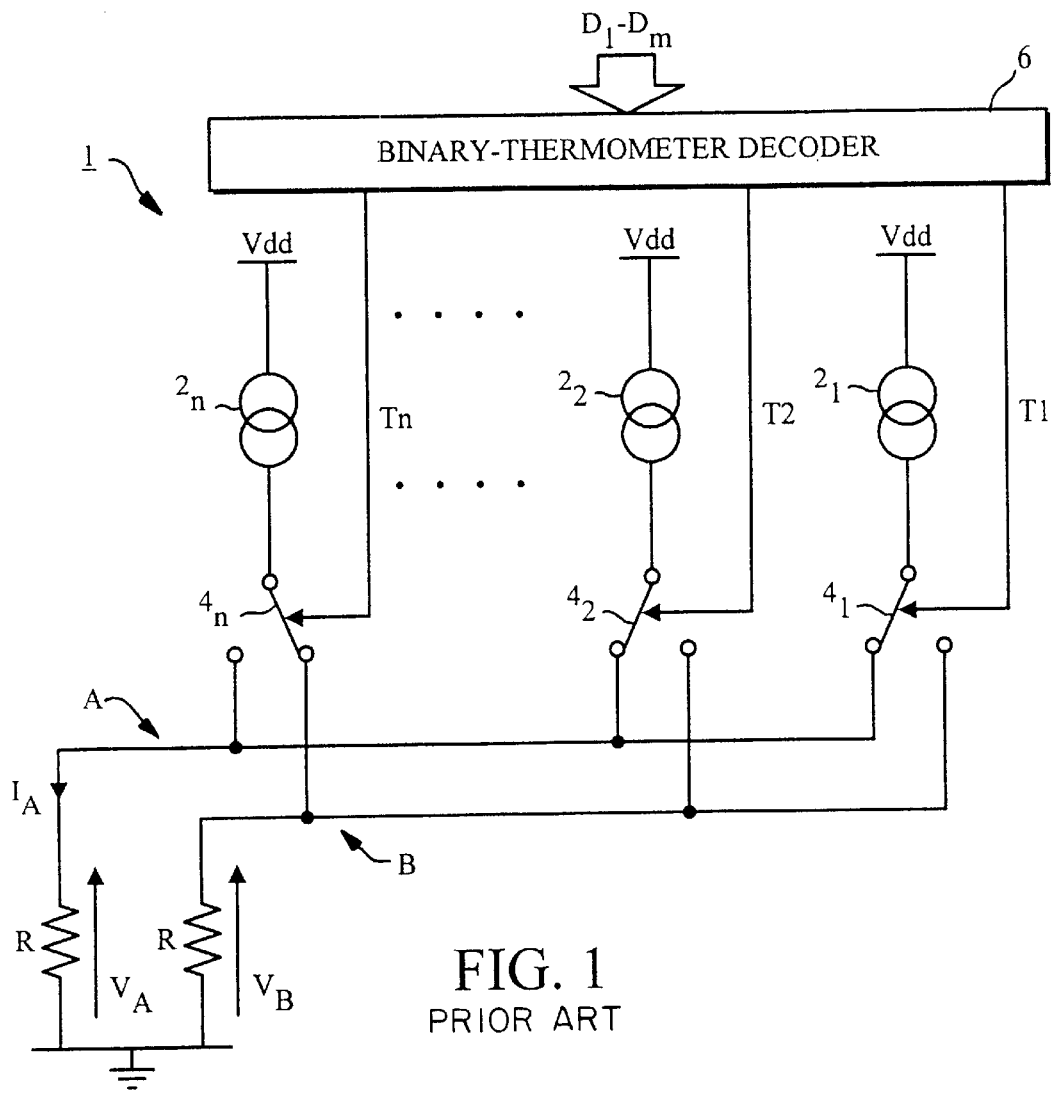
FIG. 1, discussed hereinbefore, shows parts of a conventional DAC.
FIG. 2, also discussed hereinbefore, presents a table showing thermometer-coded signals derived from a binary input word.
Figure 3:
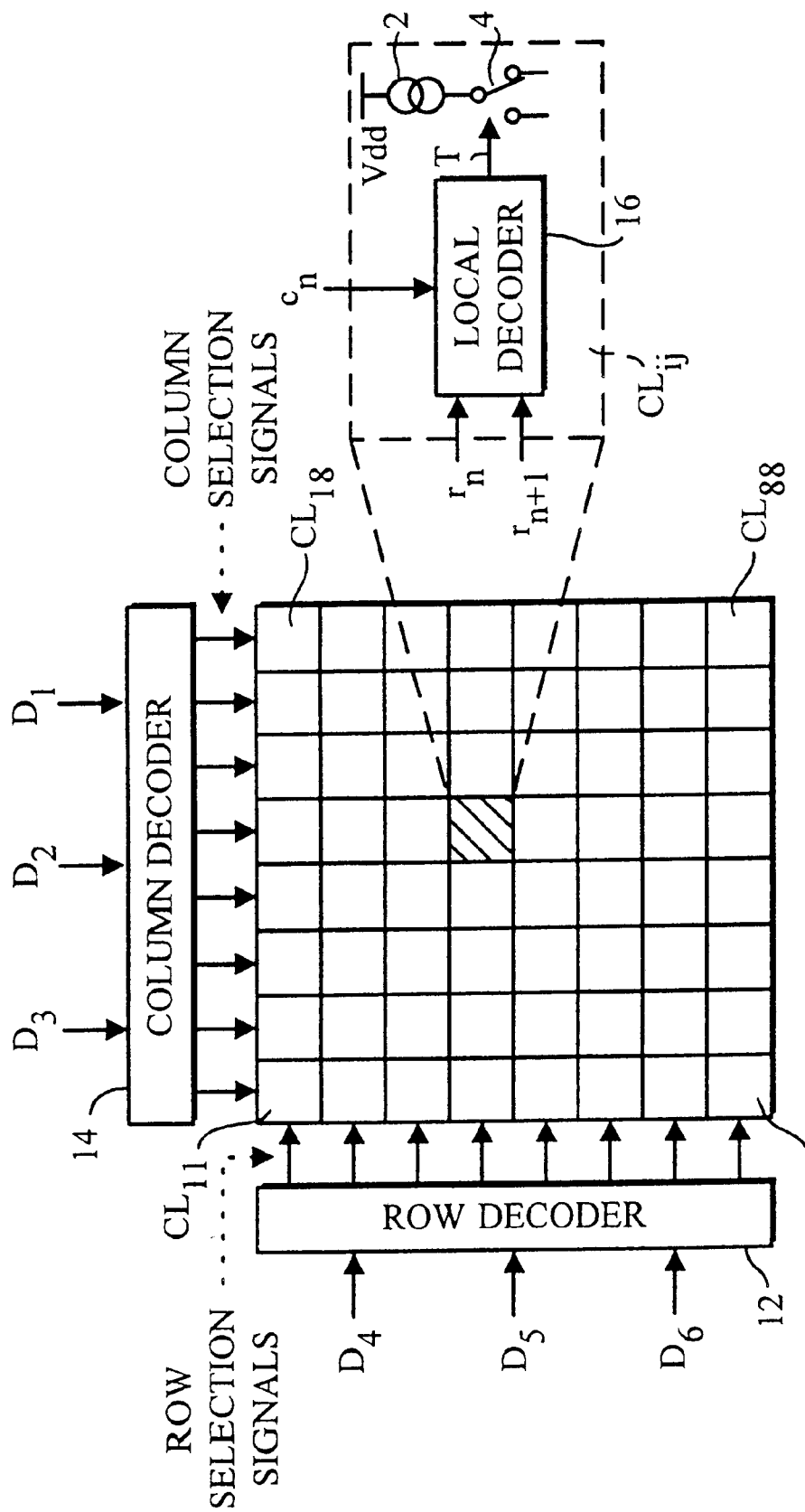
FIG. 3, also discussed hereinbefore, shows a two-dimensional array of cells previously proposed for use in a DAC.

Alternatively, it is possible to use just one set of column selection signals and one set of depth selection signals and to have these sets coded according to the normal (FIG. 2) thermometer coding technique, i.e. coded as the row selection signals are coded in the second embodiment.

It will be appreciated that it is not necessary for the cells in the second embodiment to be arranged physically in three dimensions. Only a logical arrangement is required. For example, the different layers in FIG. 10 could be arranged side-by-side as square arrays on a common substrate. Alternatively, the cells 0 to 15 of the four row 0's could be arranged as one square array, the cells 16 to 31 of the four row 1's could be arranged as a "row-1" array by the side of the "row-0" array on a common substrate, and so on. Respective "column-0", "column-1" etc. square arrays of 16 cells could also be arrayed side by side on a common substrate. The square arrays themselves could be subdivided in turn into lines or blocks.

In the first embodiment it is not necessary that the number of rows be equal to the number of columns. Similarly, in the second embodiment, the dimensions in the row, column and depth directions can be mutually-different.

It is also possible for the coding technique embodying the present invention to produce selection signals having more than three "dimensions" (i.e. one or more further dimensions in addition to the row, column and depth directions of the second embodiment).

Although thermometer coding techniques have been described above in particular relation to DACs, it will be understood that these techniques can be applied usefully in any type of circuitry in which there are a plurality of similarly-constituted circuit elements (cells) that must be activated in a sequential manner to perform respective predetermined operations. For example, the coding techniques can be applied in mixers and in programmable current generators.

What I claim is:

1. Coding circuitry, for producing a set of thermometer-coded output signals in dependence upon a binary input signal, wherein, as the input signal increases progressively in value from a first value to a second value, the output signals of the set are activated in a predetermined sequence and, as the input signal increases progressively in value from said second value to a third value, the output signals of the set are deactivated in a predetermined sequence, the predetermined activation and deactivation sequences for the output signals being such that the first output signal to be activated in the activation sequence is the last output signal to be deactivated in the deactivation sequence.

2. Coding circuitry as claimed in claim 1, wherein when the input-signal value changes from any value to the next-highest value or to the next-lowest value, at most one of the output signals of the set is activated or deactivated.

3. Coding circuitry as claimed in claim 1, wherein, when the input signal decreases in value from said second value to the next-lowest value, none of the output signals of the set is changed.

4. Coding circuitry, for producing respective first and second sets of thermometer-coded output signals in dependence upon a binary input signal, wherein, as the input signal increases progressively in value from a first value to a second value, the first-set output signals are activated in a predetermined sequence and the second-set output signals are deactivated in a predetermined sequence, and, as the input signal increases progressively in value from said second value to a third value, the first-set output signals are deactivated in a predetermined sequence and the second-set output signals are activated in a predetermined sequence.

5. Coding circuitry as claimed in claim 4, wherein, when the input-signal value changes from any value to the next-highest value or the next-lowest value, at most only one first-set output signal is activated or deactivated and at most only one second-set output signal is activated or deactivated.

6. Coding circuitry as claimed in claim 4, wherein, when the input signal decreases from said second value to the next-lowest value, none of the first-set output signals is changed and none of the second-set output signals is changed.

7. Coding circuitry as claimed in claim 4, wherein when the input signal changes from one value to another value the number of output signals that are deactivated in one of the first and second output-signal sets is equal to the number of output signals that are activated in the other of the first and second output-signal sets.

8. Cell array circuitry including:

a plurality of cells arrayed logically in rows and columns, each cell of the array having local decoder means connected for receiving a row selection signal corresponding to its row and a column selection signal corresponding to its column, and operable, in dependence upon the received row and column selection signals, to produce a control signal for use in controlling a predetermined operation of the cell;

a row decoder for producing said row selection signals corresponding respectively to said rows; and a column decoder including coding circuitry, for producing a set of thermometer-coded output signals in dependence upon a binary input signal, wherein, as the input signal increases progressively in value from a first value to a second value, the output signals of the set are activated in a predetermined sequence and, as the input signal increases progressively in value from said second value to a third value, the output signals of the set are deactivated in a predetermined sequence, said column selection signals being provided respectively by said output signals of the coding circuitry.

9. Cell array circuitry as claimed in claim 8, wherein when the input-signal value changes from any value to the next-highest value or to the next-lowest value, at most one of the output signals of the set is activated or deactivated.

10. Cell array circuitry as claimed in claim 8, wherein, when the input signal decreases in value from said second value to the next-lowest value, none of the output signals of the set is changed and one of the row selection signals is changed.

11. Cell array circuitry as claimed in claim 8, wherein said row selection signals are also thermometer-coded signals.

12. Cell array circuitry as claimed in claim 8, wherein each cell is also connected for receiving the row selection signal corresponding to the next row of the array.

13. Cell array circuitry as claimed in claim 12, wherein:

the array of cells has alternate first and second rows;

the local decoder means in each first-row cell is operable to produce its said control signal when said row selection signal corresponding to the cell's row and said column selection signal corresponding to the cell's column are both activated or when said row selection signal corresponding to the next row is activated; and the local decoder means in each second-row cell is operable to produce its said control signal when said row selection signal corresponding to the cell's row is activated and said column selection signal corresponding to the cell's column is deactivated or when said row selection signal corresponding to the next row is activated.

14. Cell array circuitry as claimed in claim 8, wherein said row decoder is connected for receiving a first portion of a binary input-word signal applied to the cell array circuitry and produces said row selection signals in dependence upon the first portion, and said column decoder is connected for receiving a second portion of that binary input-word signal, which portion constitutes said binary input signal of said coding circuitry.

15. Cell array circuitry including:

a plurality of cells arrayed logically in rows and columns, each cell of the array having local decoder means connected for receiving a row selection signal corresponding to its row and a column selection signal corresponding to its column, and operable, in dependence upon the received row and column selection signals, to produce a control signal for use in controlling a predetermined operation of the cell, the cell array having alternate first and second rows;

a row decoder for producing said row selection signals corresponding respectively to said rows; and a column decoder including coding circuitry, for producing respective first and second sets of thermometer-coded output signals in dependence upon a binary input signal, wherein, as the input signal increases progressively in value from a first value to a second value, the first-set output signals are activated in a predetermined sequence and the second-set output signals are deactivated in a predetermined sequence, and, as the input signal increases progressively in value from said second value to a third value, the first-set output signals are deactivated in a predetermined sequence and the second-set output signals are activated in a predetermined sequence, each column having respective first and second column selection signals corresponding to the column concerned, the first column selection signals corresponding to the different columns being provided respectively by the first-set output signals of the coding circuitry and the second column selection signals corresponding to the different columns being provided respectively by the second-set output signals of the coding circuitry; and for each column of the array, the local decoder means of first-row cells of the column concerned are connected to receive said first column selection signal corresponding to the column concerned, and the local decoder means of second-row cells of the column concerned are connected to receive the second column selection signal corresponding to the column concerned.

16. Coding circuitry as claimed in claim 15, wherein, when the input-signal value changes from any value to the next-highest value or the next-lowest value, at most only one first-set output signal is activated or deactivated and at most only one second-set output signal is activated or deactivated.

17. Coding circuitry as claimed in claim 15, wherein, when the input signal decreases from said second value to the next-lowest value, none of the first-set output signals is changed and none of the second-set output signals is changed and one of the row selection signals is changed.

18. Coding circuitry as claimed in claim 15, wherein when the input signal changes from one value to another value the number of output signals that are deactivated in one of the first and second output-signal sets is equal to the number of output signals that are activated in the other of the first and second output-signal sets.

19. Cell array circuitry as claimed in claim 15, wherein said row selection signals are also thermometer-coded signals.

20. Cell array circuitry as claimed in claim 15, wherein each cell is also connected for receiving the row selection signal corresponding to the next row of the array.

21. Cell array circuitry as claimed in claim 15, wherein said local decoder means in each cell is operable to produce its said control signal when said row selection signal corresponding to the cell's row and said column selection signal corresponding to the cell's column are both activated or when said row selection signal corresponding to the next row of the array is activated.

22. Cell array circuitry as claimed in claim 15, wherein said row decoder is connected for receiving a first portion of a binary input-word signal applied to the cell array circuitry and produces said row selection signals in dependence upon the first portion, and said column decoder is connected for receiving a second portion of that binary input-word signal, which portion constitutes said binary input signal of said coding circuitry.

23. A digital-to-analog converter comprising cell array circuitry that includes:

a plurality of cells arrayed logically in rows and columns, each cell of the array having local decoder means connected for receiving a row selection signal corresponding to its row and a column selection signal corresponding to its column, and operable, in dependence upon the received row and column selection signals, to produce a control signal for use in controlling a predetermined operation of the cell;

a row decoder for producing said row selection signals corresponding respectively to said rows; and a column decoder including coding circuitry, for producing a set of thermometer-coded output signals in dependence upon a binary input signal, wherein, as the input signal increases progressively in value from a first value to a second value, the output signals of the set are activated in a predetermined sequence and, as the input signal increases progressively in value from said second value to a third value, the output signals of the set are deactivated in a predetermined sequence, said column selection signals being provided respectively by said output signals of the coding circuitry;

wherein each of said cells comprises a current source or current sink and a switch circuit having an input connected to the current source/sink of the cell and also having respective first and second outputs, and operable selectively, in dependence upon said control signal, to connect its said input to its said first output or to its said second output.

24. A digital-to-analog converter as claimed in claim 23, wherein the respective current sources/sinks of said cells source/sink identical currents.

25. A digital-to-analog converter as claimed in claim 23, wherein the respective first outputs of the cells are connected together to a first summing path of the converter and the respective second outputs of the cells are connected together to a second summing path of the converter.

26. A digital-to-analog converter comprising cell array circuitry that includes:

a plurality of cells arrayed logically in rows and columns, each cell of the array having local decoder means connected for receiving a row selection signal corresponding to its row and a column selection signal corresponding to its column, and operable, in dependence upon the received row and column selection signals, to produce a control signal for use in controlling a predetermined operation of the cell, the cell array having alternate first and second rows;

a row decoder for producing said row selection signals corresponding respectively to said rows; and a column decoder including coding circuitry, for producing respective first and second sets of thermometer-coded output signals in dependence upon a binary input signal, wherein, as the input signal increases progressively in value from a first value to a second value, the first-set output signals are activated in a predetermined sequence and the second-set output signals are deactivated in a predetermined sequence, and, as the input signal increases progressively in value from said second value to a third value, the first-set output signals are deactivated in a predetermined sequence and the second-set output signals are activated in a predetermined sequence, each column having respective first and second column selection signals corresponding to the column concerned, the first column selection signals corresponding to the different columns being provided respectively by the first-set output signals of the coding circuitry and the second column selection signals corresponding to the different columns being provided respectively by the second-set output signals of the coding circuitry; and for each column of the array, the local decoder means of first-row cells of the column concerned are connected to receive said first column selection signal corresponding to the column concerned, and the local decoder means of second-row cells of the column concerned are connected to receive the second column selection signal corresponding to the column concerned;

wherein each of said cells comprises a current source or current sink and a switch circuit having an input connected to the current source/sink of the cell and also having respective first and second outputs, and operable selectively, in dependence upon said control signal, to connect its said input to its said first output or to its said second output.

27. A digital-to-analog converter as claimed in claim 26, wherein the respective current sources/sinks of said cells source/sink identical currents.

28. A digital-to-analog converter as claimed in claim 26, wherein the respective first outputs of the cells are connected together to a first summing path of the converter and the respective second outputs of the cells are connected together to a second summing path of the converter.

29. Coding circuitry, for producing thermometer-coded output signals in dependence upon binary input signals, including:

first coding means connected for receiving a first binary input signal and operable to derive therefrom a first set of thermometer-coded output signals;

second coding means connected for receiving a second binary input signal and operable to derive therefrom a second set of thermometer-coded output signals; and third coding means connected for receiving a third binary input signal and operable to derive therefrom a third set of thermometer-coded output signals.

30. Coding circuitry as claimed in claim 29, wherein at least two of said first, second and third binary input signals are derived from a common input-word signal.

31. Coding circuitry as claimed in claim 29, wherein all of said first, second and third binary input signals are derived from a common input-word signal.

32. Coding circuitry as claimed in claim 31, wherein said first, second and third binary input signals are derived from different respective portions of said common input-word signal.

33. Coding circuitry as claimed in claim 29, wherein the output-signal set derived by at least one of said first, second and third coding means is a smoothed output-signal set in which, as the received binary input signal increases progressively from a first value to a second value, the output signals derived by the coding means concerned are activated in a predetermined sequence and, as the received binary input signal increases progressively in value from said second value to a third value, the output signals are deactivated in a predetermined sequence.

34. Coding circuitry as claimed in claim 33, wherein the or each coding means that derives such a smoothed output-signal set is also operable to derive a further smoothed set of thermometer-coded output signals in dependence upon its said received binary input signal such that, as the received binary input signal increases progressively in value from said first value to said second value, the output signals of the further smoothed set are deactivated in a predetermined sequence and, as the received binary input signal increases progressively in value from said second value to said third value, the output signals of the further smoothed set are activated in a predetermined sequence.

35. Cell array circuitry including:
a plurality of cells arrayed logically in respective first, second and third dimensions, each cell of the array having local decoder means connected for receiving a first-dimension selection signal corresponding to its first-dimension position in the array and a second-dimension selection signal corresponding to its second-dimension position in the array and a third-dimension selection signal corresponding to its third-dimension position in the array, and operable, in dependence upon the received selection signals, to produce a control signal for use in controlling a predetermined operation of the cell; and coding circuitry, for producing thermometer-coded output signals in dependence upon binary input signals, including:
first coding means connected for receiving a first binary input signal and operable to derive therefrom a first set of thermometer-coded output signals;
second coding means connected for receiving a second binary input signal and operable to derive therefrom a second set of thermometer-coded output signals; and
third coding means connected for receiving a third binary input signal and operable to derive therefrom a third set of thermometer-coded output signals;
said first-dimension, second-dimension and third-dimension selection signals being provided respectively by said first, second and third output-signal sets.

36. Cell array circuitry as claimed in claim 35, wherein each cell is also connected for receiving the first-dimension selection signal corresponding to the next first-dimension position of the array and the second-dimension selection signal corresponding to the next second-dimension position of the array.

37. Cell array circuitry as claimed in claim 35, wherein:
said third coding means are operable to derive first and second smoothed output-signal sets, wherein, as said third input signal increases progressively in value from a first value to a second value, the first-set output signals are activated in a predetermined sequence and the second-set output signals are deactivated in a predetermined sequence, and, as said third input signal increases progressively in value from said second value to a third value, the first-set output signals are deactivated in a predetermined sequence and the second-set output signals are activated in a predetermined sequence, the first and second smoothed output-signal sets serving to provide, for each third-dimension position, a first third-dimension selection signal corresponding to that position and a second third-dimension selection signal corresponding to that position;
the cell array having alternate first and second second-dimension positions; and
for each third-dimension position, the local decoder means of cells at the first second-dimension positions are connected to receive said first third-dimension selection signal corresponding to the third-dimension position concerned, and the local decoder means of cells at the second second-dimension positions are connected to receive said second third-dimension selection signal corresponding to the third-dimension position concerned.

38. Cell array circuitry as claimed in claim 37, wherein said second coding means are operable to produce first and second smoothed output-signal sets, wherein, as said second input signal increases progressively in value from a first value to a second value, the first-set output signals are activated in a predetermined sequence and the second-set output signals are deactivated in a predetermined sequence, and, as said second input signal increases progressively in value from said second value to a third value, the first-set output signals are deactivated in a predetermined sequence and the second-set output signals are activated in a predetermined sequence, the first and second smoothed output-signal sets serving to provide, for each second-dimension position, a first second-dimension selection signal corresponding to that position and a second second-dimension selection signal corresponding to that position;
the cell array having alternate first and second first-dimension positions; and
for each second-dimension position, the local decoder means cells at the first first-dimension positions are connected to receive said first second-dimension selection signal corresponding to the second-dimension position concerned, and the local decoder means of cells at the second first-dimension positions are connected to receive said second second-dimension selection signal corresponding to the second-dimension position concerned.

39. Cell array circuitry as claimed in claim 37, wherein said second coding means are operable to produce two such smoothed output-signal sets serving to provide, for each second-dimension position, a first second-dimension selection signal corresponding to that position and a second second-dimension selection signal corresponding to that position;
the cell array having alternate first and second first-dimension positions; and
for each second-dimension position, the local decoder means cells at the first first-dimension positions are connected to receive said first second-dimension selection signal corresponding to the second-dimension position concerned, and the local decoder means cells at the second first-dimension positions are connected to receive said second second-dimension selection signal corresponding to the second-dimension position concerned.

40. A digital-to-analog converter comprising cell array circuitry that includes:
a plurality of cells arrayed logically in respective first, second and third dimensions, each cell of the array having local decoder means connected for receiving a first-dimension selection signal corresponding to its first-dimension position in the array and a second-dimension selection signal corresponding to its second-dimension position in the array and a third-dimension selection signal corresponding to its third-dimension position in the array, and operable, in dependence upon the received selection signals, to produce a control signal for use in controlling a predetermined operation of the cell; and coding circuitry, for producing thermometer-coded output signals in dependence upon binary input signals, including:
- first coding means connected for receiving a first binary input signal and operable to derive therefrom a first set of thermometer-coded output signals;
- second coding means connected for receiving a second binary input signal and operable to derive therefrom a second set of thermometer-coded output signals; and
- third coding means connected for receiving a third binary input signal and operable to derive therefrom a third set of thermometer-coded output signals;

said first-dimension, second-dimension and third-dimension selection signals being provided respectively by said first, second and third output-signal sets respectively;

wherein each of said cells comprises a current source or current sink and a switch circuit having an input connected to the current source/sink of the cell and also having respective first and second outputs, and operable selectively, in dependence upon said control signal, to connect its said input to its said first output or to its said second output.

41. A digital-to-analog converter as claimed in claim 40, wherein the respective current sources/sinks of said cells source/sink identical currents.

42. A digital-to-analog converter as claimed in claim 40, wherein the respective first outputs of the cells are connected together to a first summing path of the converter and the respective second outputs of the cells are connected together to a second summing path of the converter.

* * * * *

UNITED STATES PATENT AND TRADEMARK OFFICE
CERTIFICATE OF CORRECTION

PATENT NO.: 6,163,283
DATED : December 19, 2000
INVENTOR(S): William George John SCHOFIELD It is certified that error appears in the above-identified patent and that said Letters Patent is hereby corrected as shown below:

On the title page, [30] Foreign Application Priority Data, change "9800384" to --9800384.1--.

Signed and Sealed this

First Day of May, 2001

Attest:

NICHOLAS P. GODICI

*Attesting Officer*   *Acting Director of the United States Patent and Trademark Office*